(12) United States Patent
Kim et al.

(10) Patent No.: US 7,224,730 B2
(45) Date of Patent: May 29, 2007

(54) SYSTEMS AND METHODS FOR DECODING REDUNDANT MOTION VECTORS IN COMPRESSED VIDEO BITSTREAMS

(75) Inventors: Chang-Su Kim, Seoul (KR); Ioannis Katsavounidis, Pasadena, CA (US)

(73) Assignee: Intervideo, Inc., Fremont, CA (US)

( * ) Notice: Subject to any disclaimer, the term of this patent is extended or adjusted under 35 U.S.C. 154(b) by 1172 days.

(21) Appl. No.: 10/092,339

(22) Filed: Mar. 5, 2002

(65) Prior Publication Data
US 2002/0176505 A1 Nov. 28, 2002

Related U.S. Application Data

(60) Provisional application No. 60/286,280, filed on Apr. 25, 2001, provisional application No. 60/275,859, filed on Mar. 14, 2001, provisional application No. 60/273,443, filed on Mar. 5, 2001.

(51) Int. Cl.
H04B 1/66 (2006.01)
(52) U.S. Cl. ............. 375/240.08; 375/240.25; 375/240.16; 375/240.26; 375/240.12; 348/699; 392/233; 392/235; 392/238; 392/243
(58) Field of Classification Search ........... 375/240.08, 375/240.25, 240.16, 240.26, 240.12; 348/699; 382/233, 235, 236, 238, 243
See application file for complete search history.

(56) References Cited

U.S. PATENT DOCUMENTS

| 5,436,664 | A | 7/1995 | Henry |
| 5,502,573 | A | 3/1996 | Fujinami |
| 5,912,707 | A | 6/1999 | Kim |
| 5,936,674 | A | 8/1999 | Kim |
| 5,995,171 | A | 11/1999 | Enari et al. |
| 6,141,448 | A | 10/2000 | Khansari et al. |
| 6,148,026 | A | 11/2000 | Puri et al. |
| 6,307,885 | B1 * | 10/2001 | Moon et al. ........... 375/240.08 |
| 7,003,033 | B2 * | 2/2006 | Kim et al. ................. 375/240 |

OTHER PUBLICATIONS

U.S. Appl. No. 10/092;366, filed Mar. 5, 2002, Kim et al.
U.S. Appl. No. 10/092;376, filed Mar. 5, 2002, Katsavounidis et al.
U.S. Appl. No. 10/092;353, filed Mar. 5, 2002, Katsavounidis et al.
U.S. Appl. No. 10/092;384, filed Mar. 5, 2002, Kim et al.

(Continued)

Primary Examiner—Shawn S. An
(74) Attorney, Agent, or Firm—Rosenberg, Klein & Lee

(57) ABSTRACT

The invention is related to methods and apparatus that decode robustly encoded video bitstreams. One embodiment of a decoder can advantageously reconstruct a predictive-coded video object plane (P-VOP) from a standard motion vector and the previous frame; from a redundant motion vector and a frame prior to the previous frame; or from both. Advantageously, this permits the decoder to display a frame based on a reconstructed VOP in the presence of unfavorable environmental conditions, such as interference, delays, and the like, which could otherwise corrupt a previous frame that is used as a reference by a standard decoder, such as a standard MPEG-4 decoder. One embodiment is advantageously backwards compatible with standard MPEG-4 compliant bitstreams and retrieves redundant motion vector information from user data video packets. One embodiment includes at least one extra frame buffer or memory, which stores a reference frame corresponding to a redundant motion vector.

10 Claims, 17 Drawing Sheets

OTHER PUBLICATIONS

U.S. Appl. No. 10/092;340, filed Mar. 5, 2002, Kim et al.
U.S. Appl. No. 10/092;375, filed Mar. 5, 2002, Kim et al.
U.S. Appl. No. 10/092;345, filed Mar. 5, 2002, Kim et al.
U.S. Appl. No. 10/092;392, filed Mar. 5, 2002, Katsavounidis et al.
U.S. Appl. No. 10/092;383, filed Mar. 5, 2002, Zhao et al.
U.S. Appl. No. 10/092;373, filed Mar. 5, 2002, Kim et al.
U.S. Appl. No. 10/092;394, filed Mar. 5, 2002, Katsavounidis et al.
M. Budagavi and J. D. Gibson, "Error propagation in motion compensated video over wireless channels," in Proc. ICIP'97, vol. 2, Oct. 1997, pp. 89-92.
JinGyeong Kim, JongWon Kim and C.-C. Jay Kuo, "An Integrated AIR/UEP Scheme for Robust Video Transmission with a Corruption Model" Paper presented at ITCOM 2001 (Aug. 2001).
Chang-Su Kim, Ph.D. Thesis, "On the Techniques for Robust Transmission of Video Sequence over Noisy Channel" Graduate School of Seoul National University, Department of Electrical Engineering, Aug. 2000 pp. 1-140.
Seung Hwan Kim, Chang-Su Kim, and Sang-Uk Lee, "Enhanced motion compensation algorithm based on second-order prediction," Proc. ICIP-2000, vol. 2, pp. 875-878, Sep. 2000.
Chang-Su Kim, Rin-Chul Kim, and Sang-Uk Lee, "Robust transmission of video sequence using double-vector motion compensation," IEEE Transactions on Circuits and Systems for Video Technology, vol. 11, No. 9, pp. 1011-1021, Sep. 2001.
Lifeng Zhao, Jitae Shin, JongWon Kim, and C.-C. Jay Kuo, "FGS MPEG-4 video streaming with constant quality rate adaptation, prioritized packetization and differentiated forward," in Proc. SPIE ITCOM 2001: Video Technologies for Multimedia Applications, Denver, CO, Aug. 2001.
Lifeng Zhao, JongWon Kim, and C.-C. Jay Kuo, "MPEG-4 FGS video streaming with constant-quality rate control and differentiated forwarding," in Proc. SPIE Visual Communications and Image Processing 2002, San Jose, CA, Jan. 2002.

* cited by examiner

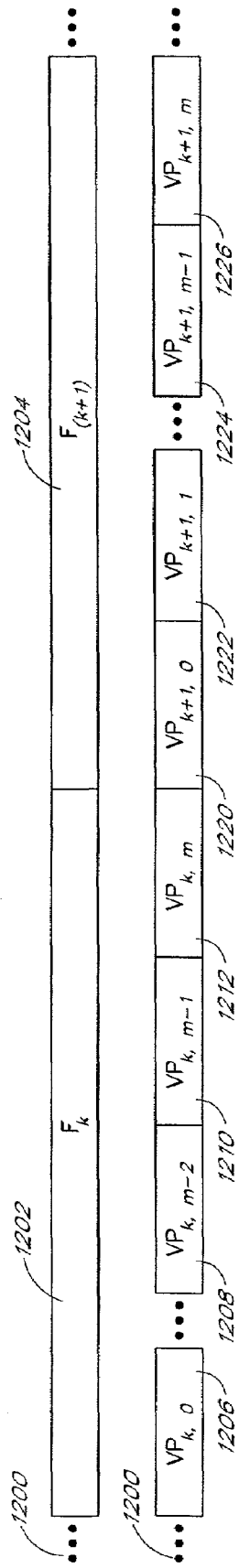
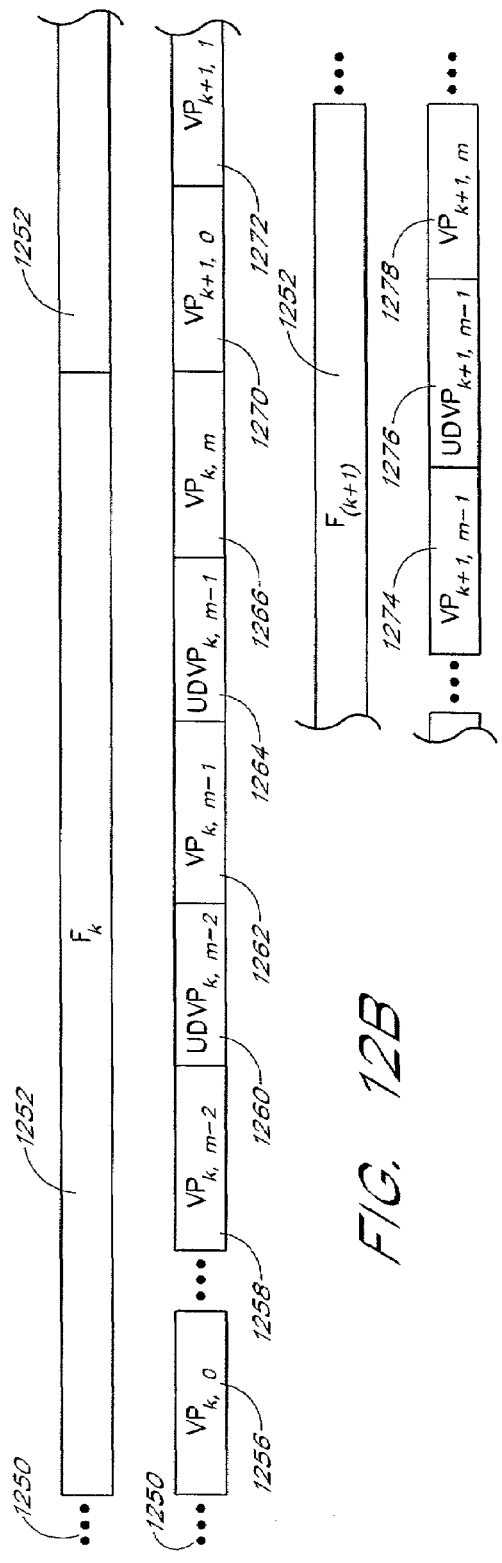
FIG. 12A (PRIOR ART)
FIG. 12B

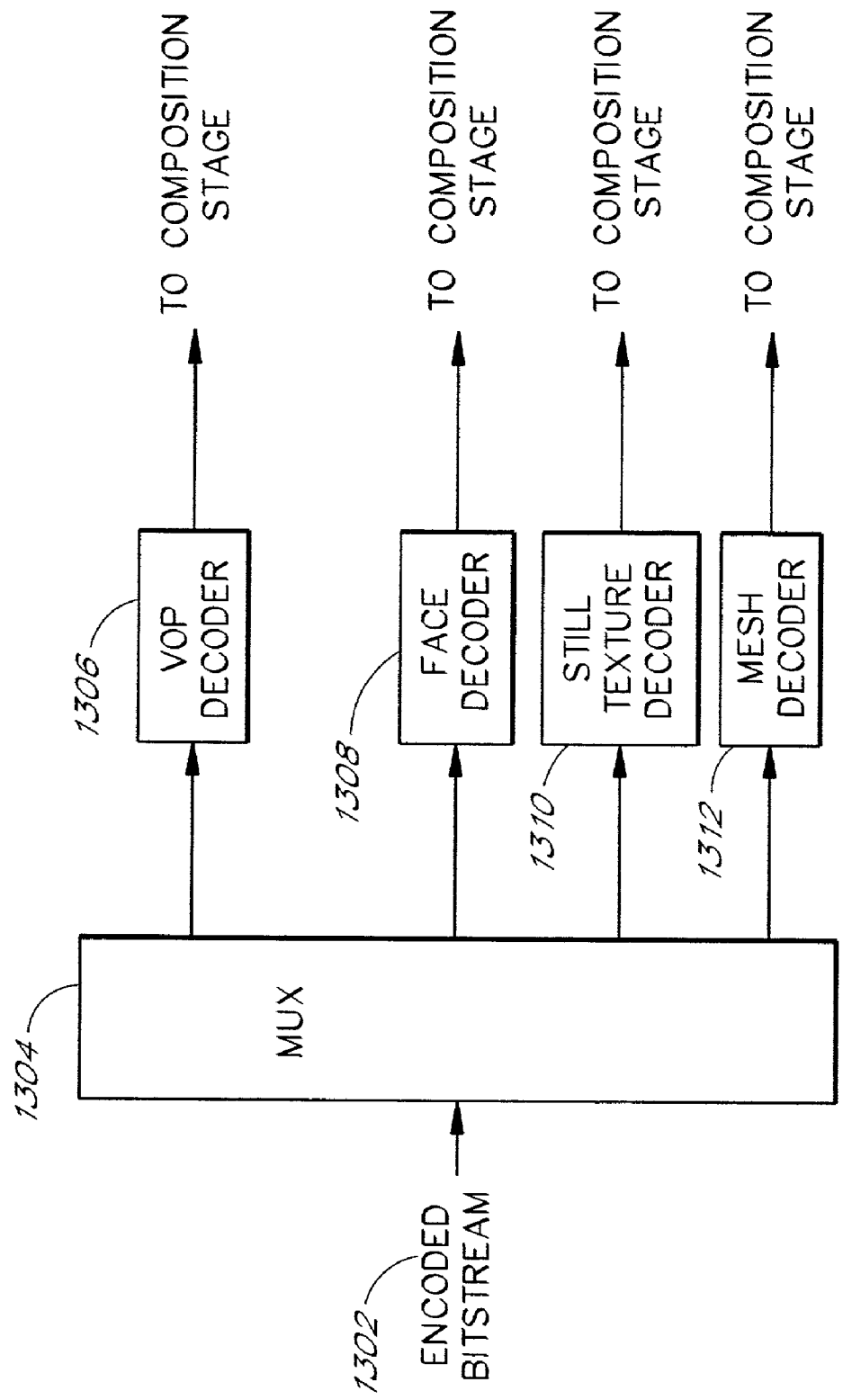

SYSTEMS AND METHODS FOR DECODING REDUNDANT MOTION VECTORS IN COMPRESSED VIDEO BITSTREAMS

RELATED APPLICATION

This application claims the benefit under 35 U.S.C. § 119(e) of U.S. Provisional Application No. 60/273,443, filed Mar. 5, 2001; U.S. Provisional Application No. 60/275,859, filed Mar. 14, 2001; and U.S. Provisional Application No. 60/286,280, filed Apr. 25, 2001, the entireties of which are hereby incorporated by reference.

APPENDIX A

Appendix A, which forms a part of this disclosure, is a list of commonly owned copending U.S. patent applications. Each of the applications listed in Appendix A is hereby incorporated by reference herein in its entirety.

COPYRIGHT RIGHTS

A portion of the disclosure of this patent document contains material which is subject to copyright protection. The copyright owner has no objection to the facsimile reproduction by any one of the patent document or the patent disclosure, as it appears in the Patent and Trademark Office patent file or records, but otherwise reserves all copyright rights whatsoever.

BACKGROUND OF THE INVENTION

1. Field of the Invention

The invention is related to video decoding techniques. In particular, the invention relates to systems and methods of decoding video code to reduce error propagation in the presence of transmission errors.

2. Description of the Related Art

A variety of digital video compression techniques have arisen to transmit or to store a video signal with a lower bandwidth or with less storage space. Such video compression techniques include international standards, such as H.261, H.263, H.263+, H.263++, H.26L, MPEG-1, MPEG-2, MPEG-4, and MPEG-7. These compression techniques achieve relatively high compression ratios by discrete cosine transform (DCT) techniques and motion compensation (MC) techniques, among others. Such video compression techniques permit video bitstreams to be efficiently carried across a variety of digital networks, such as wireless cellular telephony networks, computer networks, cable networks, via satellite, and the like.

Unfortunately for users, the various mediums used to carry or transmit digital video signals do not always work perfectly, and the transmitted data can be corrupted or otherwise interrupted. Such corruption can include errors, dropouts, and delays. Corruption occurs with relative frequency in some transmission mediums, such as in wireless channels and in asynchronous transfer mode (ATM) networks. For example, data transmission in a wireless channel can be corrupted by environmental noise, multipath, and shadowing. In another example, data transmission in an ATM network can be corrupted by network congestion and buffer overflow.

Corruption in a data stream or bitstream that is carrying video can cause disruptions to the displayed video. Even the loss of one bit of data can result in a loss of synchronization with the bitstream, which results in the unavailability of subsequent bits until a synchronization codeword is received. These errors in transmission can cause frames to be missed, blocks within a frame to be missed, and the like. One drawback to a relatively highly compressed data stream is an increased susceptibility to corruption in the transmission of the data stream carrying the video signal.

Those in the art have sought to develop techniques to mitigate against the corruption of data in the bitstream. For example, error concealment techniques can be used in an attempt to hide errors in missing or corrupted blocks. However, error concealment does not work well where the corrupted block is not similar in appearance to adjacent blocks. In another example, forward error correction (FEC) techniques are used to recover corrupted bits, and thus reconstruct data in the event of corruption. However, FEC techniques disadvantageously introduce redundant data, which increases the bandwidth of the bitstream for the video or decreases the amount of effective bandwidth remaining for the video. Also, FEC techniques are computationally complex to implement. In addition, conventional FEC techniques are not compatible with the international standards, such as H.261, H.263, MPEG-2, and MPEG-4, but instead, have to be implemented at a higher, "systems" level.

One approach to mitigate against corrupted data is to modify the syntax of the video coders to use a single motion vector with a lag value that indicates the frame number from which the motion is referenced, i.e., the motion vector depends on one of several previous frames. See Budagavi, M., et al., "Error Propagation in Motion Compensated Video over Wireless Channels," *Proc. ICIP '97*, Vol. 2 (October 1997), pp. 89–92. Disadvantageously, only a single motion vector is transmitted, and there is no redundancy. Further disadvantageously, the lag value is not part of the international standards so that a video encoded with single motion vectors and lag values is not backwards compatible with a decoder that decodes motion vectors based on only the previous frame, such as decoders that are compatible with the international standards of H.261, H.263, MPEG-2, and MPEG-4.

Another approach to mitigate against corrupted data is to use double-vector motion compensation. Each block in a k-th frame, $F_k$, is motion compensated from a weighted superposition of a motion vector from a block in a previous frame, $F_{k-1}$, and a block from a frame that is previous to the previous frame, $F_{k-2}$. When one of these two blocks is corrupted, the decoder suppresses its error propagation by predicting the block in the k-th frame, $F_k$, from the remaining block that is not corrupted, either $F_{k-1}$ or $F_{k-2}$. See Kim, C.-S., et al., "Robust Transmission of Video Sequence Using Double-Vector Motion Compensation," *IEEE Transactions on Circuits and Systems for Video Technology*, Vol. 11, No. 9 (September 2001), pp. 1011–1021. However, the double-vector motion compensation technique is not backward compatible with existing international standards, such as H.261, H.263, MPEG-2, and MPEG-4.

SUMMARY OF THE INVENTION

The invention is related to methods and apparatus that decode robustly encoded video bitstreams. One embodiment of a decoder can advantageously reconstruct a predictive-coded video object plane (P-VOP) from a standard motion vector and the previous frame; from a redundant motion vector and a frame prior to the previous frame; or from both. Advantageously, this permits the decoder to display a frame based on a reconstructed VOP in the presence of unfavorable environmental conditions, such as interference, delays, and the like, which could otherwise corrupt a previous frame that is used as a reference by a standard decoder, such as a standard MPEG-4 decoder. One embodiment is advantageously backwards compatible with standard MPEG-4 compliant bitstreams and retrieves redundant motion vector information from user data video packets. One embodiment includes at least one extra frame buffer or memory, which stores a reference frame corresponding to a redundant motion vector.

One embodiment of the invention includes a video decoder adapted to decode robustly encoded video information comprising: a demultiplexer adapted to parse data from the video bitstream; motion decoder configured to receive motion information from the demultiplexer, where the motion decoder is configured to be able to decode motion information for a standard motion vector, which is referenced to a previous frame, where the motion decoder is further configured to be able to decode motion information from a redundant motion vector, which is referenced to a frame prior to the previous frame; a texture decoder configured to receive texture information from the demultiplexer and decode a texture of the VOP; and a composition circuit adapted to combine multiple VOPs to generate a video frame.

Another embodiment includes a video object plane (VOP) decoder in a video decoder that is adapted to decode a VOP in a first frame, comprising: a first memory configured to store a reconstructed VOP from a second frame, where the second frame is a frame immediately prior to the first frame; a second memory configured to store a reconstructed VOP from a third frame, where the third frame is a frame that is prior to the second frame; a first motion decoder configured to decode a standard motion vector from an encoded bitstream that is related to motion of the first reconstructed VOP in the first memory; a second motion decoder configured to decode a redundant motion vector from the encoded bitstream that is related to motion of the second reconstructed VOP in the second memory; and a motion compensator that is configured to reconstruct a VOP at least in part from information provided by at least one of the first motion decoder and the second motion decoder.

Another embodiment includes a process of decoding a video bitstream that includes redundant motion vectors for at least some predictive-coded video object planes (P-VOPs), the process comprising: receiving the video bitstream; decoding video object planes (VOPS) of a first frame from the video bitstream; detecting that a first reference VOP from a second frame is not available, where the second frame is a reference frame for a standard motion vector for a P-VOP of the first frame; retrieving a redundant motion vector from the video bitstream, where the redundant motion vector uses a second reference VOP from a third frame earlier in time than the second frame as a reference; and reconstructing the P-VOP from the redundant motion vector and the second reference VOP.

Another embodiment includes a process of decoding a video bitstream that includes redundant motion vectors for at least some predictive-coded video object planes (P-VOPs), the process comprising: receiving the video bitstream; decoding video object planes (VOPs) of a first frame from the video bitstream; retrieving a standard motion vector from the video bitstream to decode a P-VOP of the first frame, where the standard motion vector uses a first reference VOP from a second frame as a reference frame, where the second frame is immediately prior to the first frame; retrieving a redundant motion vector from the video bitstream, where the redundant motion vector uses a second reference VOP from a third frame earlier in time than the second frame as a reference; reconstructing a first P-VOP from the standard motion vector and the first reference VOP; reconstructing a second P-VOP from the redundant motion vector and the second reference VOP; and selecting one of the first P-VOP and the second P-VOP for use in the first frame.

Another embodiment includes a method of using a redundant motion vector that is present in an encoded video bitstream comprising: determining that a standard motion vector cannot be used to reconstruct a first video object plane (VOP); retrieving the redundant motion vector from the encoded video bitstream; retrieving a reference frame that includes a reference VOP corresponding to the redundant motion vector, where the reference frame is at least two frames prior to a frame corresponding to the first VOP; and reconstructing the first VOP at least in part from the redundant motion vector and the reference VOP.

Another embodiment includes a method of using a redundant motion vector that is present in an encoded video bitstream comprising: receiving a standard motion vector that is intended to be used to reconstruct a first video object plane (VOP) in a first frame; retrieving a first reference VOP, where the first reference VOP is selected from a second frame that is prior in time to the first frame; reconstructing a first temporary VOP from the standard motion vector and the first reference VOP; retrieving the redundant motion vector from the encoded video bitstream; retrieving a second reference VOP from a second reference frame that is at least two frames prior to the first frame; reconstructing a second temporary VOP at least in part from the redundant motion vector and the second reference VOP; and selecting between the first temporary VOP and the second temporary VOP to provide the first VOP.

Another embodiment includes a method of using a reference frame for the reconstruction of a predictive-coded visual object plane (P-VOP), the method comprising: storing at least one video frame as the reference frame, where the stored video frame is at least two frames prior to a video frame that is being decoded for presentation in real time; retrieving the stored video frame; and using the stored video frame as the reference frame for a corresponding motion vector.

Another embodiment includes a video decoder configured to decode a video bitstream that includes redundant motion vectors for at least some predictive-coded video object planes (P-VOPs), the video decoder comprising: means for receiving the video bitstream; means for decoding video object planes (VOPs) of a first frame from the video bitstream; means for detecting that a first reference VOP from a second frame is not available, where the second frame is a reference frame for a standard motion vector for a P-VOP of the first frame; means for retrieving a redundant motion vector from the video bitstream, where the redundant motion vector uses a second reference VOP from a third frame earlier in time than the second frame as a reference; and means for reconstructing the P-VOP from the redundant motion vector and the second reference VOP.

BRIEF DESCRIPTION OF THE DRAWINGS

These and other features of the invention will now be described with reference to the drawings summarized below. These drawings and the associated description are provided to illustrate preferred embodiments of the invention and are not intended to limit the scope of the invention.

FIG. 12A illustrates a sample of a video bitstream according to the prior art.

FIG. 12B illustrates a sample of a video bitstream according to an embodiment of the invention.

FIG. 13 is a block diagram of a video decoder according to an embodiment of the invention.

DETAILED DESCRIPTION OF PREFERRED EMBODIMENTS

Although this invention will be described in terms of certain preferred embodiments, other embodiments that are apparent to those of ordinary skill in the art, including embodiments that do not provide all of the benefits and features set forth herein, are also within the scope of this invention. Accordingly, the scope of the invention is defined only by reference to the appended claims.

Embodiments of the invention advantageously allow relatively highly compressed video bitstreams, such as MPEG bitstreams, to be robustly encoded for protection against relatively spotty reception of the video bitstream. Where a video bitstream is received in real time, robust encoding is desirable because there is often not enough time to request and to receive a missing data packet in real time. Further, where reception of the video bitstream is lost, bits that are subsequently received may not be usable until re-synchronization bits are received. In addition, even when a packet of data in a video bitstream is received, if the packet is not timely received due to network congestion and the like, the packet may not be usable for decoding of the video bitstream. Advantageously, embodiments of the invention can use a redundant motion vector to reference motion even when a frame has been lost or dropped due to interference, weak signals, and the like. Further advantageously, the video bitstreams can be encoded in such a manner to retain compatibility with existing video decoders.

Figure 1:
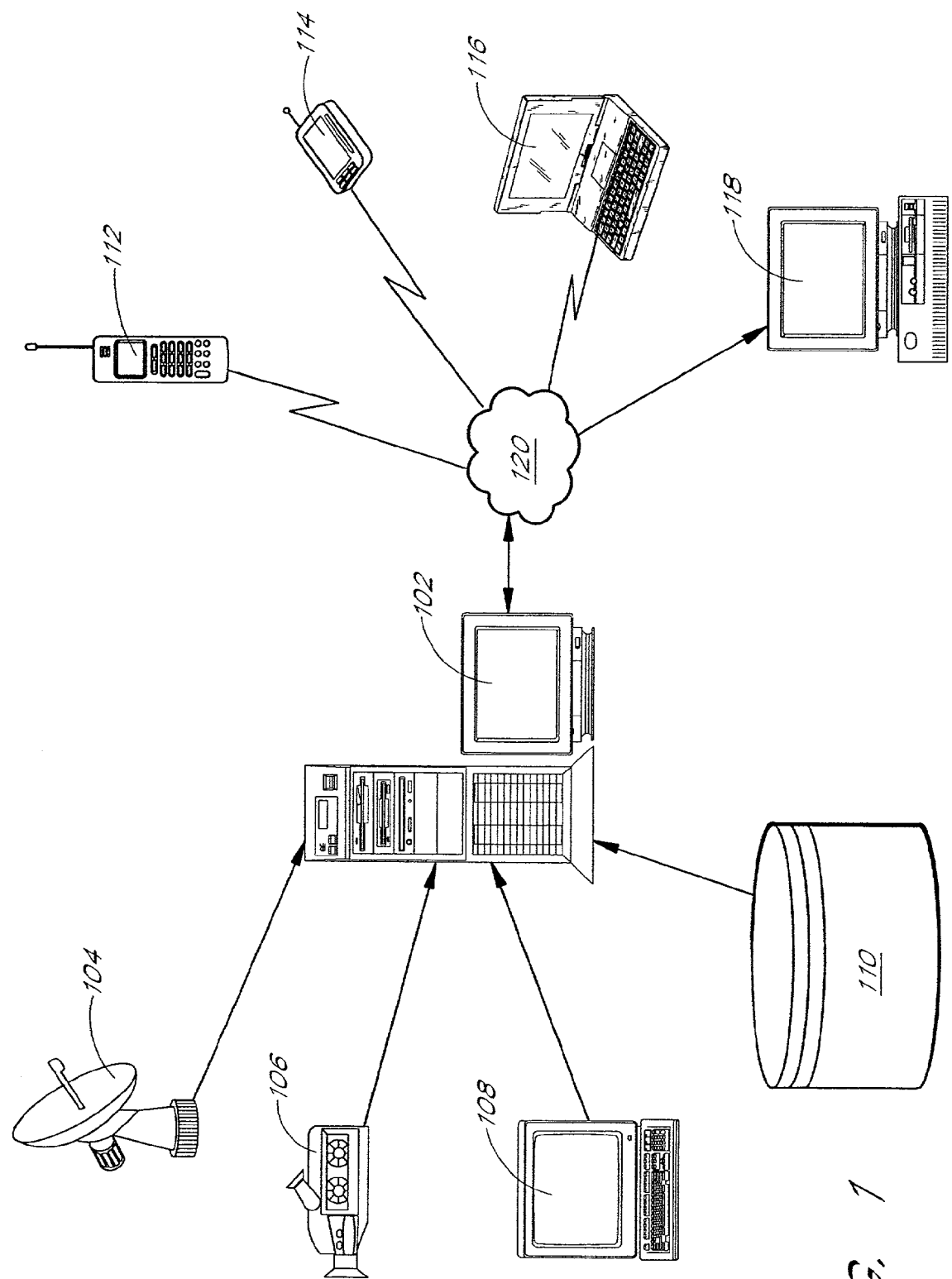
FIG. 1 illustrates a networked system for implementing a video distribution system in accordance with one embodiment of the invention.

FIG. 1 illustrates a networked system for implementing a video distribution system in accordance with one embodiment of the invention. An encoding computer 102 receives a video signal, which is to be encoded to a relatively compact and robust format. The encoding computer 102 can correspond to a variety of machine types, including general purpose computers that execute software and to specialized hardware. The encoding computer 102 can receive a video sequence from a wide variety of sources, such as via a satellite receiver 104, a video camera 106, and a video conferencing terminal 108. The video camera 106 can correspond to a variety of camera types, such as video camera recorders, Web cams, cameras built into wireless devices, and the like. Video sequences can also be stored in a data store 110. The data store 110 can be internal to or external to the encoding computer 102. The data store 110 can include devices such as tapes, hard disks, optical disks, and the like. It will be understood by one of ordinary skill in the art that a data store, such as the data store 110 illustrated in FIG. 1, can store unencoded video, encoded video, or both. In one embodiment, the encoding computer 102 retrieves unencoded video from a data store, such as the data store 110, encodes the unencoded video, and stores the encoded video to a data store, which can be the same data store or another data store. It will be understood that a source for the video can include a source that was originally taken in a film format.

The encoding computer 102 distributes the encoded video to a receiving device, which decodes the encoded video. The receiving device can correspond to a wide variety of devices that can display video. For example, the receiving devices shown in the illustrated networked system include a cell phone 112, a personal digital assistant (PDA) 114, a laptop computer 116, and a desktop computer 118. The receiving devices can communicate with the encoding computer 102 through a communication network 120, which can correspond to a variety of communication networks including a wireless communication network. It will be understood by one of ordinary skill in the art that a receiving device, such as the cell phone 112, can also be used to transmit a video signal to the encoding computer 102.

The encoding computer 102, as well as a receiving device or decoder, can correspond to a wide variety of computers. For example, the encoding computer 102 can be any microprocessor or processor (hereinafter referred to as processor) controlled device, including, but not limited to a terminal device, such as a personal computer, a workstation, a server, a client, a mini computer, a main-frame computer, a laptop computer, a network of individual computers, a mobile computer, a palm top computer, a hand held computer, a set top box for a TV, an interactive television, an interactive kiosk, a personal digital assistant (PDA), an interactive wireless communications device, a mobile browser, a Web enabled cell phone, or a combination thereof. The computer may further possess input devices such as a keyboard, a mouse, a trackball, a touch pad, or a touch screen and output devices such as a computer screen, printer, speaker, or other input devices now in existence or later developed.

The encoding computer 102, as well as a decoder, described can correspond to a uniprocessor or multiprocessor machine. Additionally, the computers can include an addressable storage medium or computer accessible medium, such as random access memory (RAM), an electronically erasable programmable read-only memory (EEPROM), hard disks, floppy disks, laser disk players, digital video devices, Compact Disc ROMs, DVD-ROMs, video tapes, audio tapes, magnetic recording tracks, electronic networks, and other techniques to transmit or store electronic content such as, by way of example, programs and data. In one embodiment, the computers are equipped with a network communication device such as a network interface card, a modem, Infra-Red (IR) port, or other network connection device suitable for connecting to a network. Furthermore, the computers execute an appropriate operating system, such as Linux, Unix, Microsoft® Windows® 3.1, Microsoft® Windows® 95, Microsoft® Windows® 98, Microsoft® Windows® NT, Microsoft® Windows® 2000, Microsoft® Windows® Me, Microsoft® Windows® XP, Apple® MacOS®, IBM® OS/2®, Microsoft® Windows® CE, or Palm OS®. As is conventional, the appropriate operating system may advantageously include a communications protocol implementation, which handles all incoming and outgoing message traffic passed over the network, which can include a wireless network. In other embodiments, while the operating system may differ depending on the type of computer, the operating system may continue to provide the appropriate communications protocols necessary to establish communication links with the network.

Figure 2:
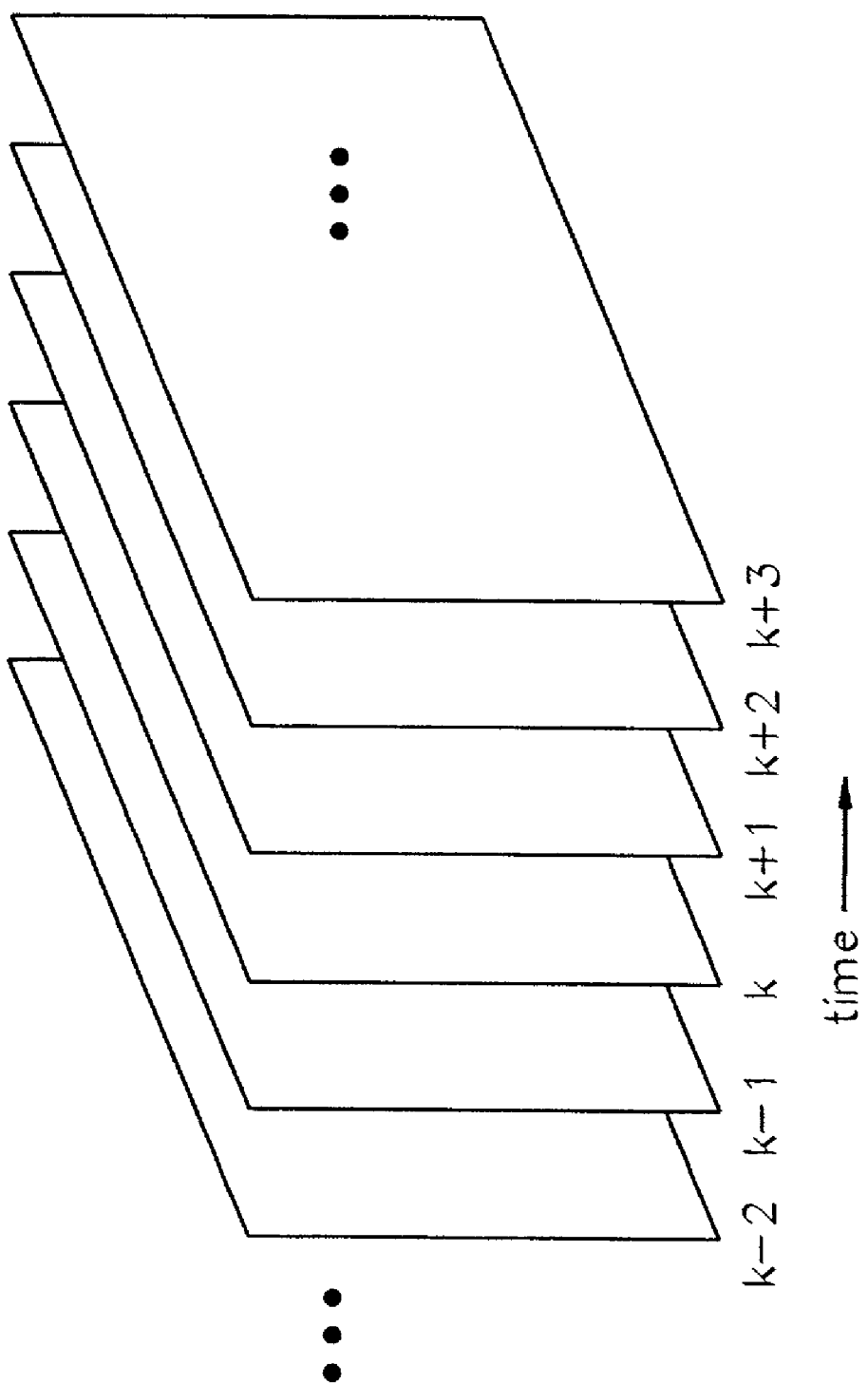
FIG. 2 illustrates a sequence of frames.

FIG. 2 illustrates a sequence of frames. A video sequence includes multiple video frames taken at intervals. The rate at which the frames are displayed is referred to as the frame rate. In addition to techniques used to compress still video, motion video techniques relate a frame at time k to a frame at time k−1 to further compress the video information into relatively small amounts of data. However, if the frame at time k−1 is not available due to an error, such as a transmission error, conventional video techniques may not be able to properly decode the frame at time k. As will be explained later, embodiments of the invention advantageously encode the video stream in a robust manner such that the frame at time k can be decoded even when the frame at time k−1 is not available.

The frames in a sequence of frames can correspond to either interlaced frames or to non-interlaced frames, i.e., progressive frames. In an interlaced frame, each frame is made of two separate fields, which are interlaced together to create the frame. No such interlacing is performed in a non-interlaced or progressive frame. While illustrated in the context of non-interlaced or progressive video, the skilled artisan will appreciate that the principles and advantages described herein are applicable to both interlaced video and non-interlaced video. In addition, while embodiments of the invention are described in the context of MPEG-4 and video object planes (VOPs), the principles and advantages described herein are also applicable to other video standards, including H.261, H.263, and MPEG-2, as well as video standards yet to be developed, which may or may not use VOPs.

The MPEG-4 standard is defined in "Coding of Audio-Visual Objects: Systems," 14496-1, ISO/IEC JTC1/SC29/WG11 N2501, November 1998, and "Coding of Audio-Visual Objects: Visual," 14496-2, ISO/IEC JTC1/SC29/WG11 N2502, November 1998, and the MPEG-4 Video Verification Model is defined in ISO/IEC JTC 1/SC 29/WG 11, "MPEG-4 Video Verification Model 17.0," ISO/IEC JTC1/SC29/WG11 N3515, Beijing, China, July 2000, the contents of which are incorporated herein in their entirety.

In an MPEG-4 system, a frame in a sequence of frames is encoded into a number of video objects known as video object planes (VOPs). A frame can be encoded into a single VOP or in multiple VOPs. In one system, such as a wireless system, each frame includes only one VOP so that a VOP is a frame. In other systems, such as MPEG-2, a frame is encoded into macroblocks. The VOPs are transmitted to a receiver, where they are decoded by a decoder back into video objects for display. A VOP can correspond to an intra-coded VOP (I-VOP), to a predictive-coded VOP (P-VOP) to a bidirectionally-predictive coded VOP (B-VOP), or to a sprite VOP (S-VOP). An I-VOP is not dependent on information from another frame or picture, i.e., an I-VOP is independently decoded. When a frame consists entirely of I-VOPs, the frame is called an I-Frame. Such frames are commonly used in situations such as a scene change. Although the lack of dependence on content from another frame allows an I-VOP to be robustly transmitted and received, an I-VOP disadvantageously consumes a relatively large amount of data or data bandwidth as compared to a P-VOP or B-VOP. To efficiently compress and transmit video, many VOPs in video frames correspond to P-VOPs.

A P-VOP efficiently encodes a video object by referencing the video object to a past VOP, i.e., to a video object (encoded by a VOP) earlier in time. This past VOP is referred to as a reference VOP. For example, where an object in a frame at time k is related to an object in a frame at time k−1, motion compensation encoded in a P-VOP can be used to encode the video object with less information than with an I-VOP. The reference VOP can be either an I-VOP or a P-VOP.

A B-VOP uses both a past VOP and a future VOP as reference VOPs. In a real-time video bitstream, a B-VOP should not be used. However, the principles and advantages described herein can also apply to a video bitstream with B-VOPs. An S-VOP is used to display animated objects.

The encoded VOPs are organized into macroblocks. A macroblock includes sections for storing luminance (brightness) components and sections for storing chrominance (color) components. The macroblocks are transmitted and received via the communication network 120. It will be understood by one of ordinary skill in the art that the communication of the data can further include other communication layers, such as modulation to and demodulation from code division multiple access (CDMA). It will be understood by one of ordinary skill in the art that the video bitstream can also include corresponding audio information, which is also encoded and decoded.

Figure 3A:
FIGS. 3A–D illustrate error propagation in a sequence of frames.
Figure 3B:
Figure 3C:
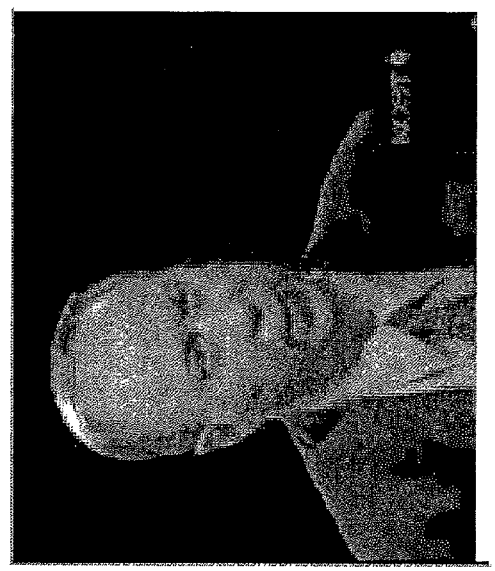
Figure 3D:
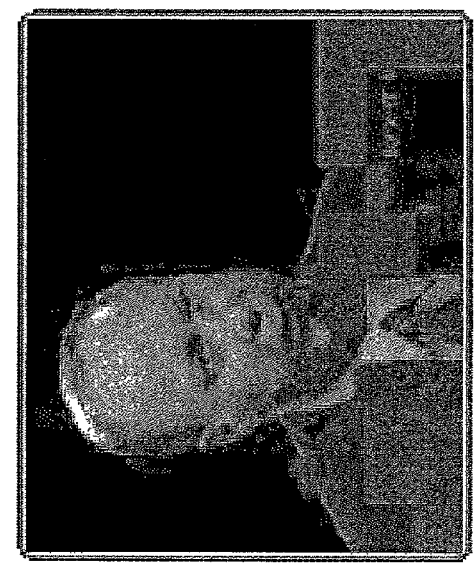

FIGS. 3A–D illustrate error propagation in a sequence of frames. FIGS. 3A and 3B correspond to images encoded and decoded without error. The scene changes between FIGS. 3A and 3B. FIGS. 3C and 3D illustrate the same scenes as FIGS. 3A and 3B, respectively, but in the presence of transmission errors. FIGS. 3C and 3D are shown with the error resiliency of a reference decoder. As illustrated in FIGS. 3C and 3D, the transmission errors undesirably propagate to the observed images. Systems and methods mitigate against these transmission errors.

Figure 4A:
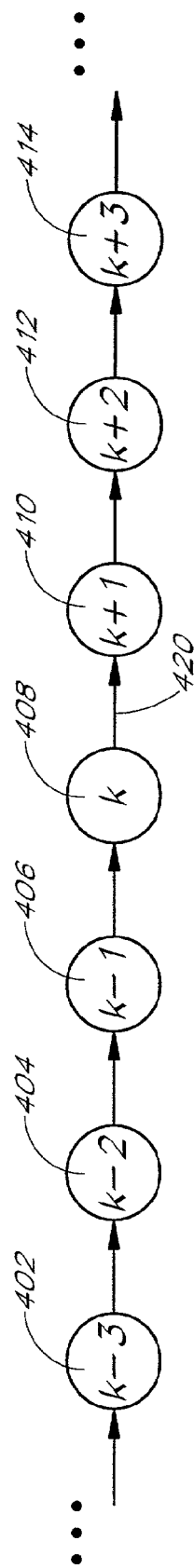
FIG. 4A illustrates a sequence of macroblocks.

FIG. 4A illustrates a sequence of macroblocks for a corresponding sequence of frames. FIG. 4A corresponds to what is encoded and sent, and what is desirably received. FIG. 4A is drawn with a first macroblock 402, a second macroblock 404, a third macroblock 406, a fourth macroblock 408, a fifth macroblock 410, a sixth macroblock 412, and a seventh macroblock 414. As drawn in FIGS. 4A and 4B, time increases to the right. The seven illustrated macroblocks 402–414 can correspond to a variety of VOP types. For example, the seven illustrated macroblocks 402–414 can correspond to a sequence of VOPs such as {I,P,P,P,P,I,P}, {P,I,P,P,I,P,I}, {I,I,P,P,P,P,P}, and the like. Where the macroblocks are properly received, the corresponding picture can be decoded as intended.

Figure 4B:
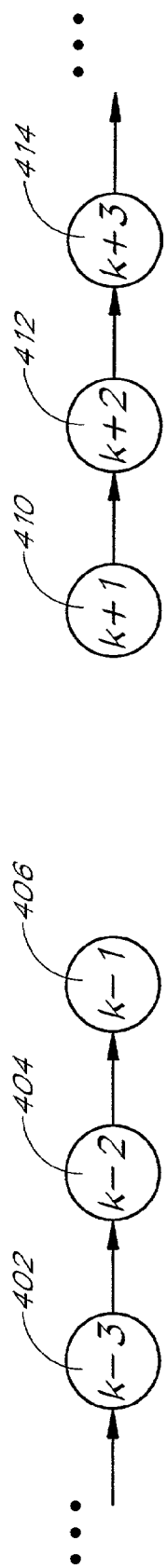
FIG. 4B illustrates a sequence of macroblocks with a missing macroblock.

FIG. 4B illustrates the effect of an error in transmission for a prior art system. In FIG. 4B, the fourth macroblock 408 is missing. The fourth macroblock 408 corresponds to a macroblock at time k. Where the fifth macroblock 410, at time k+1, depends on the fourth macroblock 408 for a reference VOP, an error in the corresponding picture may result. For example, if the fifth macroblock 410 corresponds to a P-VOP, the fifth macroblock 410 includes motion vectors that define relative motion between a VOP corresponding to the fourth macroblock 408 and the P-VOP in the fifth macroblock 410, as indicated by an arrow 420 in FIG. 4A. As illustrated by FIG. 4B however, when the fourth macroblock 408 is missing or dropped, the motion vector in the fifth macroblock 410 has no reference from which to estimate motion. Further compounding the problem, the sixth macroblock 412 and the seventh macroblock 414 can also correspond to P-VOPs, which depend on the fifth macroblock 410 and the sixth macroblock 412, respectively, to display the video object as intended. Thus, an error that occurs as a result of a single missing or dropped macroblock can undesirably propagate to multiple macroblocks.

The arrows in FIGS. 4A and 4B indicate that a VOP in a macroblock can depend on a previous or reference VOP in a prior macroblock. It will be understood by one of ordinary skill in the art that a macroblock in FIG. 4A or 4B can also correspond to an I-VOP, which does not depend on another VOP.

Figure 5A:
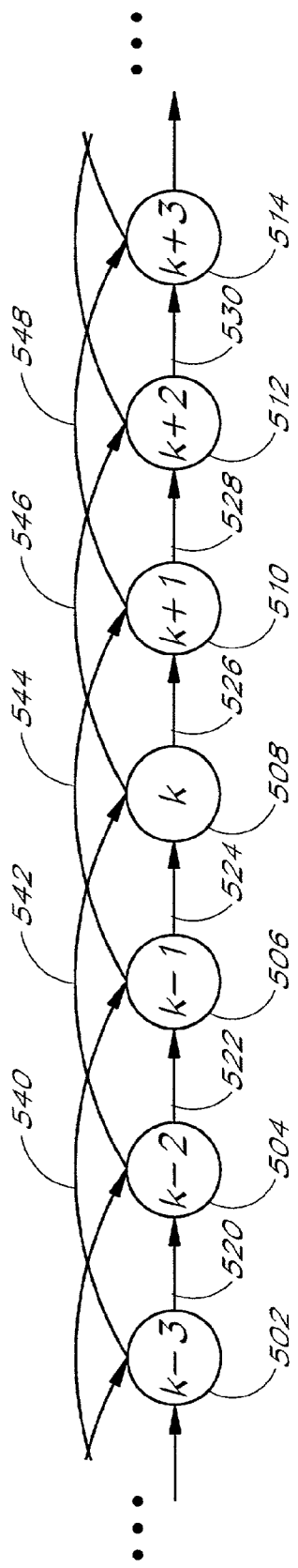
FIG. 5A illustrates a sequence of macroblocks according to an embodiment of the invention.
Figure 5B:
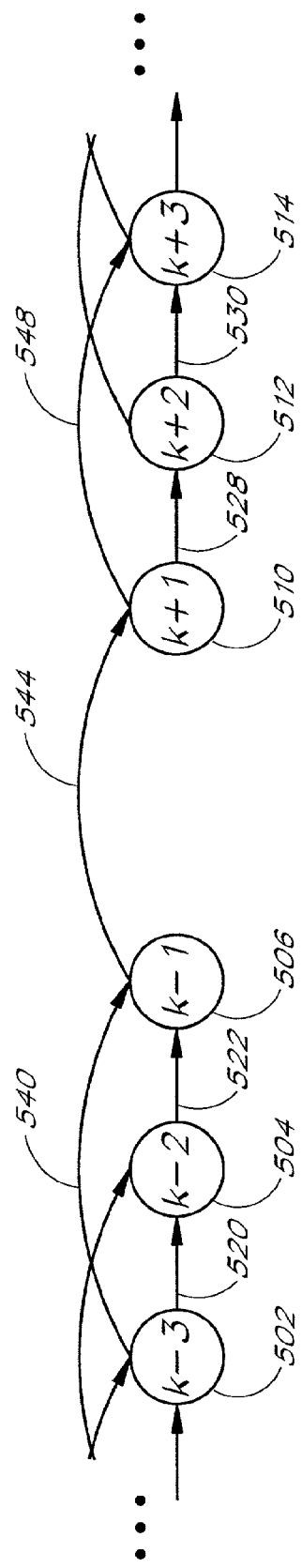
FIG. 5B illustrates a sequence of macroblocks according to an embodiment of the invention with a missing macroblock.

FIGS. 5A and 5B illustrate a sequence of macroblocks according to an embodiment of the invention. As will be explained in greater detail below, a VOP corresponding to a macroblock in the sequence at a time $t_0$ can advantageously depend not only on a VOP in a macroblock that is immediately prior ($t_0-1$) (in the previous frame), but also to a macroblock that is immediately prior to the macroblock that is immediately prior ($t_0-2$) (in the previous-previous frame). Another embodiment according to the invention where the macroblock can depend on a prior macroblock ($t_0-x$) that is prior to the immediately prior macroblock ($t_0-1$), but not necessarily the immediately prior to the immediately prior macroblock ($t_0-2$) is described later in connection with FIG. 6, i.e., can depend not only on the previous-previous frame, but on the previous-previous-previous frame, or the previous-previous-previous-previous frame, and the like.

FIG. 5A corresponds to what is encoded and transmitted, and also to what is desirably received, i.e., FIG. 5A corresponds to the case where there is no missing or dropped macroblock. FIG. 5B corresponds to the case where there is a missing or dropped macroblock.

FIG. 5A is drawn with a first macroblock 502, a second macroblock 504, a third macroblock 506, a fourth macroblock 508, a fifth macroblock 510, a sixth macroblock 512, and a seventh macroblock 514. In FIGS. 5A and 5B, time increases to the right. The illustrated macroblocks 502–514 can correspond to a variety of VOP types, such as to I-VOPs or to P-VOPs. For the purposes of illustrating principles and advantages of the sequence, the illustrated macroblocks 502–514 correspond to P-VOPs. According to the MPEG-4 standard, a P-VOP depends on a previous VOP. For example, a P-VOP in the second macroblock 504 references a VOP in the first macroblock 502, as indicated by a first arrow 520. A second arrow 522, a third arrow 524, a fourth arrow 526, a fifth arrow 528, and a sixth arrow 530 indicate potential dependencies from the contents of the third macroblock 506, the fourth macroblock 508, the fifth macroblock 510, the sixth macroblock 512, and the seventh macroblock 514, respectively, on the macroblock that is immediately prior to each.

FIG. 5A also illustrates other dependencies on prior macroblocks that are other than the immediately prior macroblock. These other dependencies are represented by curved arrows. A first curved arrow 540 represents a dependency from the third macroblock 506, which corresponds to a frame at time k–1, to the first macroblock 502, which corresponds to a frame at time k–3. The first curved arrow 540 represents a redundant motion vector that can be used as a backup when the second macroblock 504 is not properly received. The use of the redundant motion vector represented by the first curved arrow 540 can advantageously reduce errors in the display of the third frame at time k–1 and can further reduce error propagation in subsequent frames. A second curved arrow 542, a third curved arrow 544, a fourth curved arrow 546, and a fifth curved arrow 548 correspond to redundant motion vectors that can be used by VOPs in the fourth macroblock 508, the fifth macroblock 510, the sixth macroblock 512, and the seventh macroblock 514, respectively. As will be described later in connection with FIG. 12B, one embodiment of the invention advantageously encodes these redundant motion vectors to retain backward compatibility with existing MPEG-4 decoders.

It will be understood by one of ordinary skill in the art that where a macroblock corresponds to an I-VOP, that the macroblock will not depend on any other macroblock. It will be also understood by one of ordinary skill in the art that where a macroblock corresponds to an I-VOP, a subsequent macroblock with a redundant motion vector referencing a VOP prior to the I-VOP may not be practical. However, as will be described later in connection with FIG. 10, one embodiment of the invention encodes two I-VOPs in sequence, thereby allowing the utilization of a redundant motion vector referenced from a VOP prior to the immediately prior VOP.

FIG. 5B illustrates a sequence of macroblocks according to an embodiment of the invention with a missing or dropped macroblock. In FIG. 5B, the fourth macroblock 508, corresponding to a frame at time k, is missing from the sequence. This simulates the effect of missing or dropping a frame at time k due to interference or delay in receiving the corresponding video bitstream data. In a conventional MPEG-4 system, when a macroblock is dropped, a macroblock with content that is dependent on the dropped macroblock cannot properly be properly decoded as the reference VOP is missing. By contrast, in an embodiment according to the invention, where a macroblock is missing, a subsequent macroblock with a VOP that depends on a reference VOP in the missing macroblock can still be decoded. For example, where the missing macroblock is the fourth macroblock 508, a P-VOP in the fifth macroblock 510 can use the VOP in the third macroblock 506 as a reference VOP by using the redundant motion vector represented by the third curved arrow 544. As will be described later in connection with FIG. 16, one embodiment according to the invention can also use the redundant motion vector in situations other than when the reference frame for the standard motion vector is not available.

Figure 6:
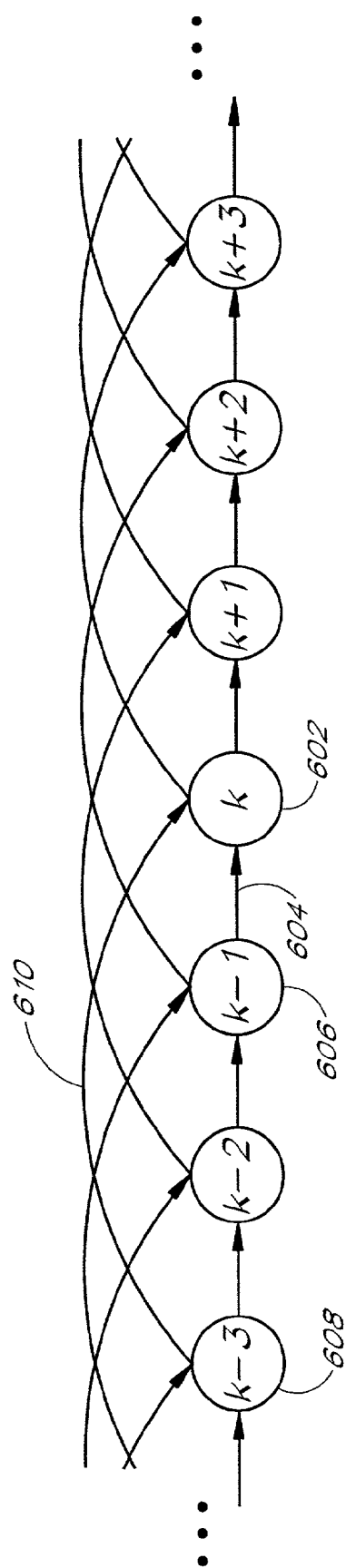
FIG. 6 illustrates a sequence of macroblocks according to an embodiment of the invention.

FIG. 6 illustrates a sequence of macroblocks according to an embodiment of the invention. In FIG. 6, a macroblock with a P-VOP can depend not only on the prior macroblock, but also on a previous-previous-previous macroblock. For example, a time-k macroblock 602 includes a standard motion vector indicated by a first arrow 604 that relates motion to a VOP carried by a time (k−1) macroblock 606 at time k−1. The P-VOP carried by the time-k macroblock 602 can also reference motion to a reference VOP carried by a time (k−3) macroblock 608 via a redundant motion vector, which is indicated by a curved arrow 610. It will be apparent to one of ordinary skill in the art that other dependencies on other macroblocks, and combinations of these dependencies are possible. For example, one embodiment according to the invention can encode a redundant motion vector by reference to a VOP selected from a previous$^2$ frame or a previous$^3$ frame, and can further include a value to indicate which frame should be used as the reference frame.

Figure 7:
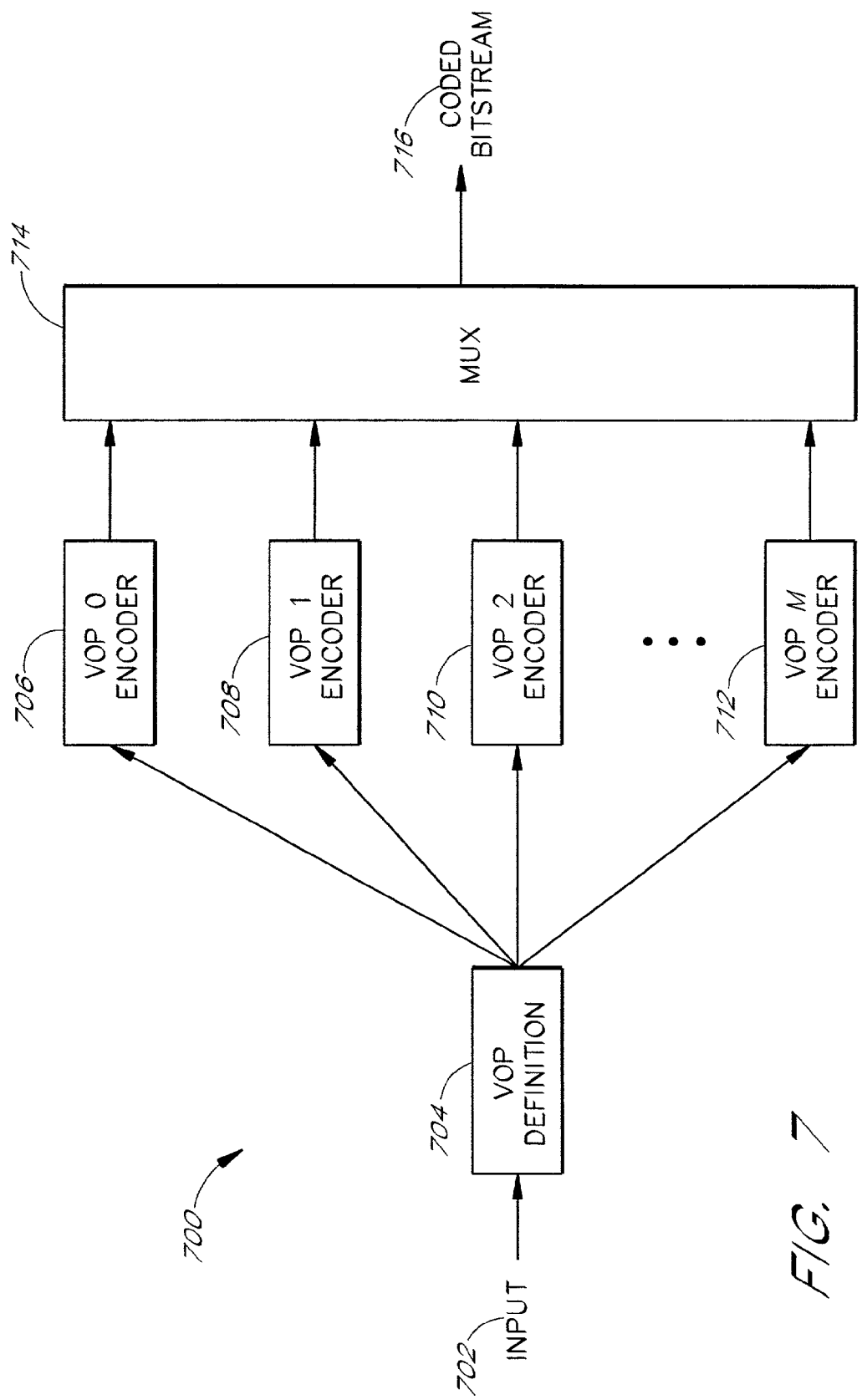
FIG. 7 is a block diagram of a video encoder according to an embodiment of the invention.

FIG. 7 is a block diagram of a video encoder 700 according to an embodiment of the invention. The video encoder 700 can be implemented by a variety of techniques, such as in dedicated hardware with an application specific integrated circuit (ASIC), a field programmable gate array (FPGA), and the like. The video encoder 700 can also be implemented by software or firmware executing by a microprocessor, microcontroller, or digital signal processor ASP) device, such as by software executing in a general purpose computer. The video encoder 700 receives video frames as an input 702. Each video frame is applied to a VOP definition stage 704, which divides the frame into video objects. It will be understood that the frame can be defined by a single video object with a rectangular shape. Each video object is encoded by encoder stages 706–712. In one embodiment, the encoder stages 706–712 code the video objects into I-VOPs or into P-VOPs. In one embodiment, when encoding a video object as a P-VOP, an encoder stage advantageously also encodes a redundant motion vector for each macroblock in a VOP. In another embodiment, a redundant motion vector is encoded for selected VOPs. Further details of one embodiment of an encoder stage configured to encode a video object as a P-VOP is described later in connection with FIG. 8. A multiplexer 714 receives the encoded VOPs and generates a coded bitstream 716, which carries the encoded video data.

Figure 8:
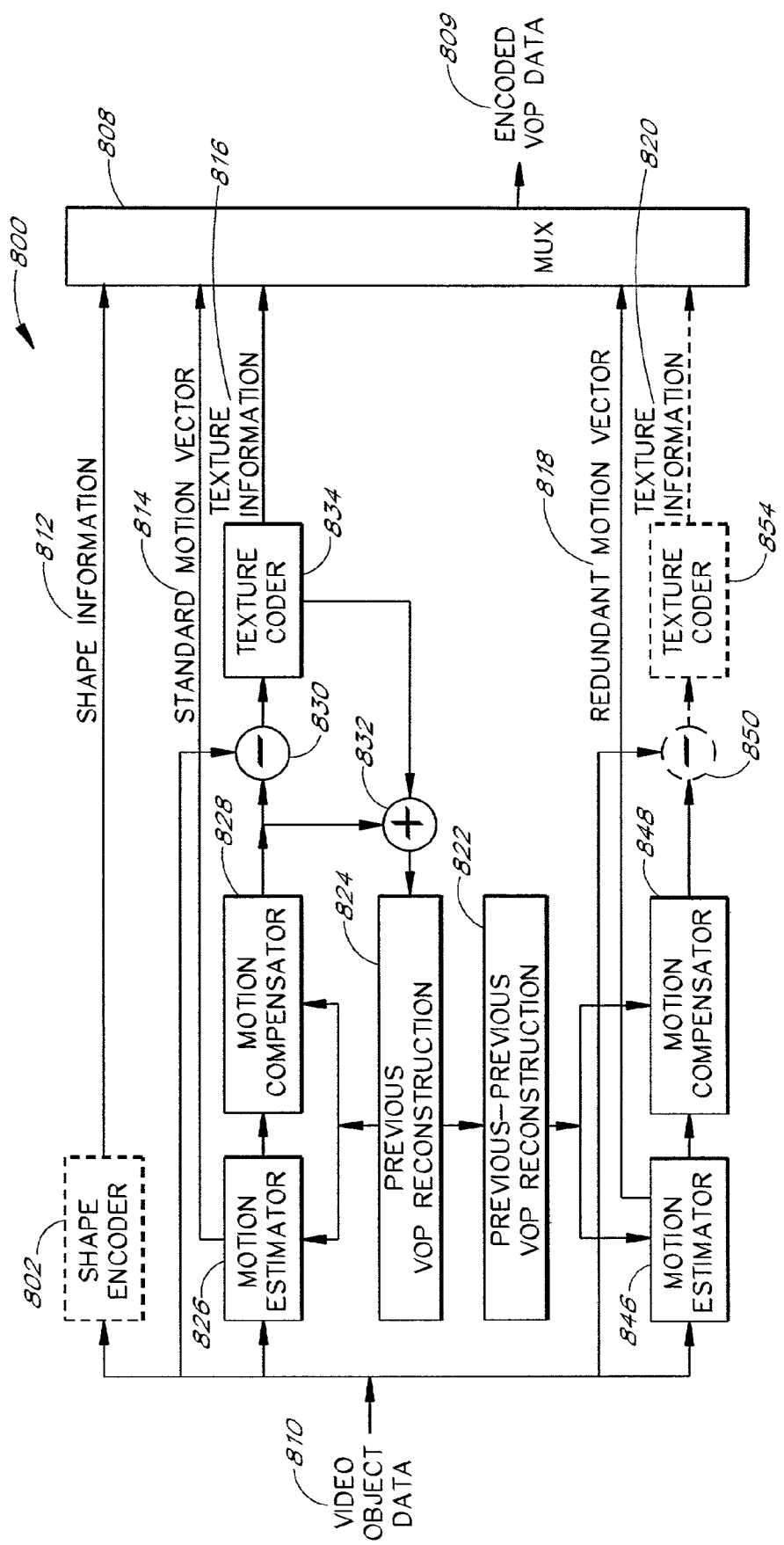
FIG. 8 is a block diagram of a predictive-coded video object plane (P-VOP) encoder according to an embodiment of the invention.

FIG. 8 is a block diagram of a predictive-coded video object plane (P-VOP) encoder 800 according to an embodiment of the invention. It will be understood by one of ordinary skill in the art that the P-VOP encoder 800 can be implemented by dedicated hardware or by software executing in a general-purpose computer. The illustrated P-VOP encoder 800 may optionally include a shape encoder 802. It will be understood that where a frame includes only one VOP, the shape encoder 802 is not needed and a shape information 812 can be hard-wired or hard-coded. Where the shape encoder 802 is used, video object data 810 is provided as an input to the shape encoder 802, which encodes the shape of the video object, and provides the shape information 812 to the multiplexer 808 as an input. For example, a video object can be encoded with a shape of rectangular.

The video object data 810 is also provided as an input to a first motion estimator 826. The first motion estimator 826 generates a standard motion vector 814, which is provided as an input to the multiplexer 808. A first texture coder 834 generates a texture information 816, which is also provided to the multiplexer 808 as an input. The multiplexer 808 time-division multiplexes the inputs to an encoded VOP data 809.

The illustrated P-VOP encoder 800 includes a previous-previous VOP reconstruction 822, a previous VOP reconstruction 824, the first motion estimator 826, a first motion compensator 828, a first differencing node 830, a first summing node 832, and the first texture coder 834. The previous-previous VOP reconstruction 822 receives the prior frame from the previous VOP reconstruction 824, so that the previous-previous VOP reconstruction 822 provides the VOP from the previous-previous frame, e.g., if a VOP from a frame at time k is encoded by the P-VOP encoder 800, the previous-previous VOP reconstruction 822 provides the corresponding VOP from the frame at time k−2. The previous video object is reconstructed from the stored VOP by the previous VOP reconstruction 824. The reconstructed previous video object is provided as an input to the first motion estimator 826 and to the first motion compensator 828.

The video object data 810 is also provided as an input to the first motion estimator 826. The first motion estimator 826 compares the video object data 810 to the reconstructed previous video object from the previous VOP reconstruction 824 and generates an estimate for a motion vector. The estimate for the motion vector is provided as an input to the first motion compensator 828. The first motion compensator 828 applies the estimated motion vector to the previous VOP from the previous VOP reconstruction 824, and provides the result to the first differencing node 830 and to the first summing node 832. The first differencing node 830 compares the motion compensated previous video object to the video object data 810, and provides the result as an input to the first texture coder 834. The first texture coder 834 encodes the texture of the video object and generates a first feedback signal, which is provided as an input to the first summing node 832. The first texture coder 834 uses techniques such as the discrete cosine transform (DCT). The first summing node 832 receives the first feedback signal from the first texture coder 834 and the estimated motion vector from the first motion compensator 828 and provides a second feedback signal as an input to the previous VOP reconstruction 824.

FIG. 8 further illustrates a second motion estimator 846 and a second motion compensator 848. The previous-previous video object is reconstructed from the stored VOP by the previous-previous VOP reconstruction 822. The reconstructed previous-previous video object is provided as an input to the second motion estimator 846 and to the second motion compensator 848.

The video object data 810 is also provided as an input to the second motion estimator 846. The second motion estimator 846 compares the video object data 810 to the reconstructed previous-previous video object from the previous-previous VOP reconstruction 822 and generates an estimate for a motion vector that references the video object from the previous-previous frame. The estimate for the motion vector is provided as an input to the second motion compensator 848. In one embodiment, the second motion compensator 848 optionally provides the result to the second differencing node 850. FIG. 8 further illustrates an optional second texture coder 854.

Figure 9:
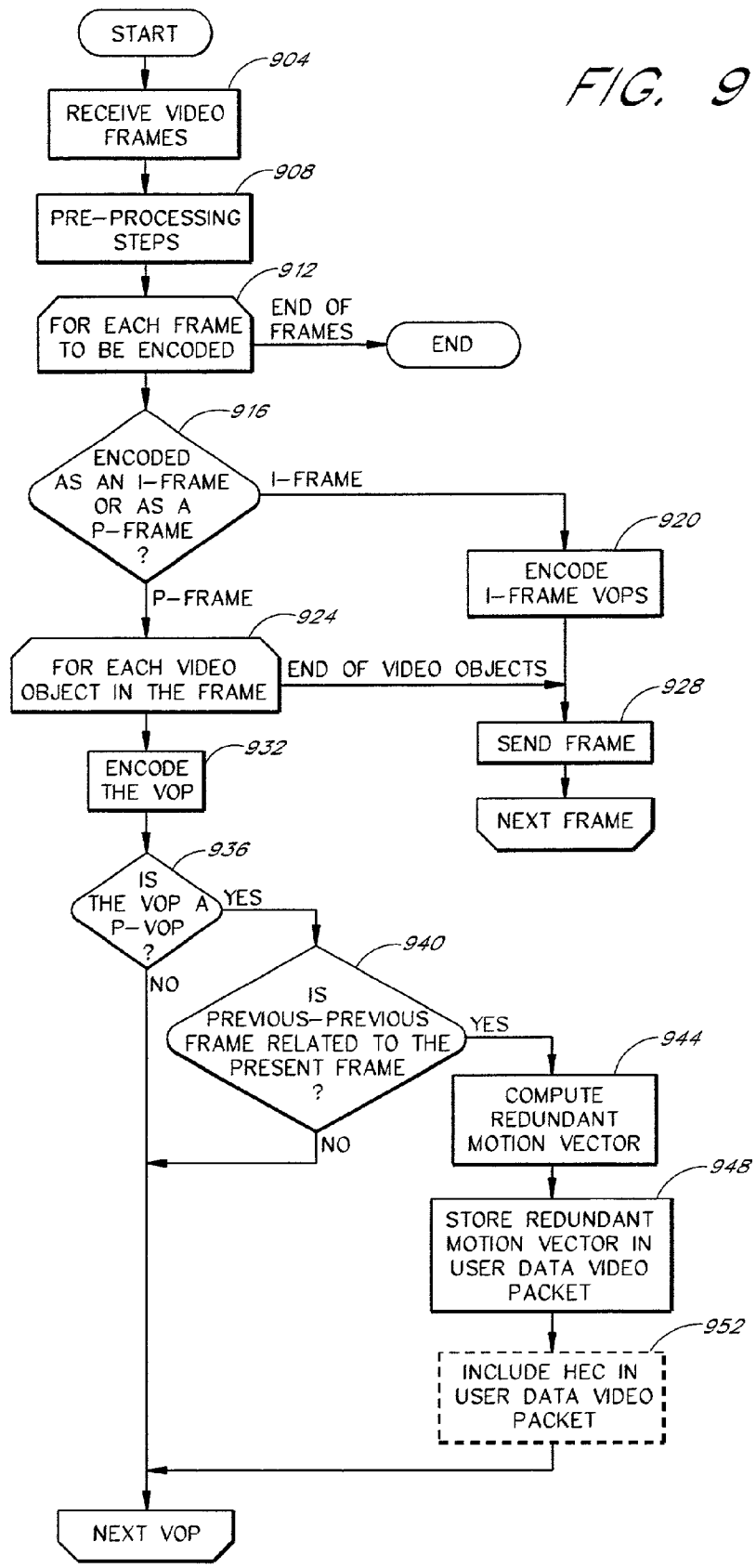
FIG. 9 is a flowchart that generally illustrates a process according to an embodiment of the invention of encoding a portion of a video bitstream to include a redundant motion vector.

FIG. 9 is a flowchart 900 that generally illustrates a process according to an embodiment of the invention of encoding a portion of a video bitstream to include a redundant motion vector that references motion relative to a VOP in a previous-previous frame. The process can be performed in real time or asynchronously in a batch process. For example, the encoded video data can be stored in a buffer or a memory device and retrieved from the buffer or the memory device after processing is complete. Another process, where a redundant motion vector references motion relative to a VOP selected from one of the previous frames, is described later in connection with FIG. 11. The process starts at a first state 904 where the process receives the sequence of video frames. The video frames can be received from video cameras, video conferencing terminals, transmissions, or retrieved from data stores such as video tapes, hard disks, and the like. The process advances from the first state 904 to a second state 908.

In the second state 908, the process performs pre-processing steps, as appropriate, to the sequence of video frames. For example, the process can add or delete frames to adjust the frame rate, can adjust the resolution of the frames, and the like. It will be understood that process does not encode a frame that is deleted from the sequence of video frames. The process advances from the second state 908 to a start of a first FOR loop 912.

In the start of the first FOR loop 912, the process evaluates whether the applicable frames of the frame sequence have been processed or whether there are more frames that are yet to be processed. When the process has completed processing of the frames, the process ends. When there are more frames to be processed, the process proceeds from the start of the first FOR loop 912 to a first decision block 916. It will be understood by one of ordinary skill in the art that the first FOR loop 912 can be implemented with other loops, such as a WHILE or GOTO loop.

In the first decision block 916, the process determines whether to encode the frame as an intra-Frame (I-Frame) or as a predictive-Frame (P-Frame). The process proceeds from the first decision block 916 to a third state 920 when the frame should be encoded as an I-Frame. The process proceeds from the first decision block 916 to a start of a second FOR loop 924 when the frame should be encoded as a P-Frame. In one embodiment, the first decision block 916 uses standard encoding decisions to determine when to encode as an I-Frame and when to encode as a P-Frame. In one embodiment, another process described later in connection with FIG. 10 determines which frames should be encoded as I-Frames and which frames should be encoded as P-Frames.

In the third state 920, all the video objects of the frame are encoded as I-VOPs and the process advances from the third state 920 to a fourth state 928.

In the start of the second FOR loop 924, the process determines whether the video objects of the frame have been processed to VOPs. When processing of the VOPs is complete, the process proceeds from the start of the second FOR loop 924 to the fourth state 928. When there are further VOPs to be processed, the process proceeds from the start of the second FOR loop 924 to a fifth state 932. It will be understood by one of ordinary skill in the art that the second FOR loop 924 can be implemented with other loops, such as a WHILE loop.

In the fourth state 928, the process sends the processed encoded frame to an output. The output can correspond to a storage device, to a transmitting device, to a transmit buffer, and the like. The process returns from the fourth state 928 to the start of the first FOR loop 912.

In the fifth state 932, the process encodes the video object to a VOP. The VOP can correspond to an I-VOP or to a P-VOP. The process advances from the fifth state 932 to a second decision block 936. In the second decision block 936, the process determines whether the VOP was encoded as an I-VOP or as a P-VOP. The process proceeds from the second decision block 936 to a third decision block 940 when the VOP corresponds to a P-VOP. The process returns from the second decision block 936 to the start of the second FOR loop 924.

In the third decision block 940, the process determines whether the previous-previous frame is related to the present frame. The process proceeds from the third decision block 940 to a sixth state 944 when the previous-previous frame is related to the present frame. The process returns from the third decision block 940 to the start of the second FOR loop 924 when the previous-previous frame is unrelated to the present frame. When the previous-previous frame is unrelated to the present frame, a P-VOP in the present frame should not be referenced to the previous-previous frame. An example of when the previous-previous frame is unrelated to the present frame occurs when there is an intervening scene change between the previous-previous frame and the present frame. As will be described later in connection with FIG. 10, one embodiment of the process further encodes scene changes and/or rapidly changing scenes as consecutive I-VOPs, which allows a redundant motion vector in a P-VOP to reference a VOP in a previous-previous frame and provide robust encoding.

In the sixth state 944, the process computes a redundant motion vector for the present VOP based on a corresponding VOP in the previous-previous frame. The process advances from the sixth state 944 to a seventh state 948.

In the seventh state 948, the process stores the redundant motion vector in a user data video packet. Advantageously, storage of the redundant motion vector in the user data video packet allows the generated video bitstream to be backward compatible with standard MPEG-4 decoders. Although a standard MPEG-4 decoder is not capable of utilizing the redundant motion vector data, the presence of the redundant motion vector data advantageously does not disturb the MPEG-4 decoder from decoding the other portions of the video bitstream, which can comply with the MPEG-4 standard. A standard MPEG-4 decoder ignores data that is present in a user data video packet. The user data video packet is indicated by providing a user data start code, which is a bit string of 000001B2 in hexadecimal (start code value of B2), as the start code of the data packet. The user data start code instructs a standard MPEG-4 decoder to ignore data received after the user data start code until the receipt of another start code. In one embodiment, the next start code corresponds to a VOP start code, which has a start code value of B6 (hex). Further details of the user data video packet are described later in connection with FIG. 12B. The process advances from the seventh state 948 to an optional eighth state 952.

In the optional eighth state 952, the process includes a header extension code (HEC) to the user data video packet generated in the seventh state 948. The presence of the HEC permits a decoder that is capable of utilizing the redundant motion vector to use the contents of the user data video packet, i.e., use the redundant motion vector, even if the other packets relating to the P-VOP are lost. The process returns from the optional eighth state 952 to the start of the second FOR loop 924 to process the next VOP.

Figure 10:
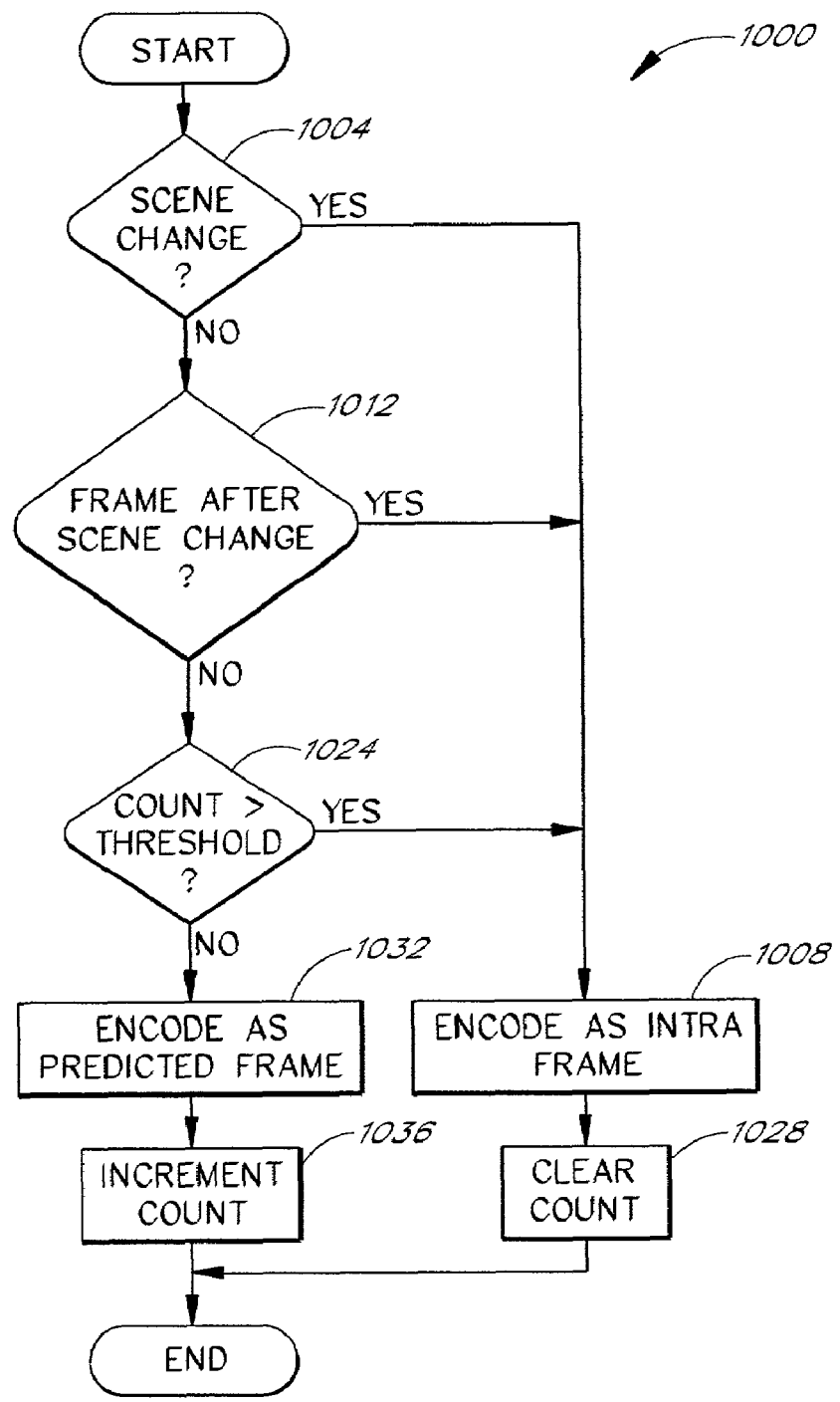
FIG. 10 is a flowchart that generally illustrates a process according to an embodiment of the invention of optionally encoding a portion of a video bitstream with sequential intra-frames to enhance the robustness of the video bitstream.

FIG. 10 is a flowchart 1000 that generally illustrates a process according to an embodiment of the invention of optionally encoding a portion of a video bitstream with sequential intra-frames (I-Frames) to enhance the robustness of the video bitstream. The process can be performed in real time or asynchronously in a batch process. The process can be used by the first decision block 916 described earlier in connection with FIG. 9 to determine when a frame should be encoded as an I-Frame and when a frame should be encoded as a P-Frame.

The process begins at a first decision block 1004. When the process detects a scene change between the present frame, e.g., frame at time k, and the previous frame, e.g., frame at time k−1, the process proceeds from the first decision block 1004 to a first state 1008. When the process does not detect a scene change between the present frame and the previous frame, the process proceeds from the first decision block 1004 to a second decision block 1012. In one embodiment, the process detects a scene change by detecting a rapidly changing scene.

In the second decision block 1012, the process determines whether the present frame is a frame that occurs after a scene change or a relatively rapidly changing scene. One embodiment encodes two consecutive I-Frames after a scene change or relatively rapidly changing scene for more robust encoding and also so that a redundant motion vector in a subsequent P-VOP can still reference a previous-previous frame. Whether a frame corresponds to a frame after a scene change can be determined by setting and reading a flag. When the present frame corresponds to a frame after a scene change or relatively rapidly changing scene, the process proceeds from the second decision block 1012 to the first state 1008. When the present frame does not correspond to the frame after a scene change, the process proceeds from the second decision block 1012 to a third decision block 1024.

In the third decision block 1024, the process inspects a count of a number of consecutive P-Frames. In some systems, it may be desirable to limit the number of consecutive P-Frames to a predetermined amount to limit a propagation of error. When the count exceeds a predetermined threshold, the process proceeds from the third decision block 1024 to the first state 1008. Otherwise, the process proceeds to a third state 1032.

In the first state 1008, the process encodes the frame as an I-Frame. The process advances from the first state 1008 to a second state 1028, where the process clears the count of consecutive P-Frames and ends.

In the third state 1032, the process encodes the frame as a P-Frame. The process advances from the third state 1032 to a fourth state 1036, where the process increments the count of consecutive P-Frames and ends.

Figure 11:
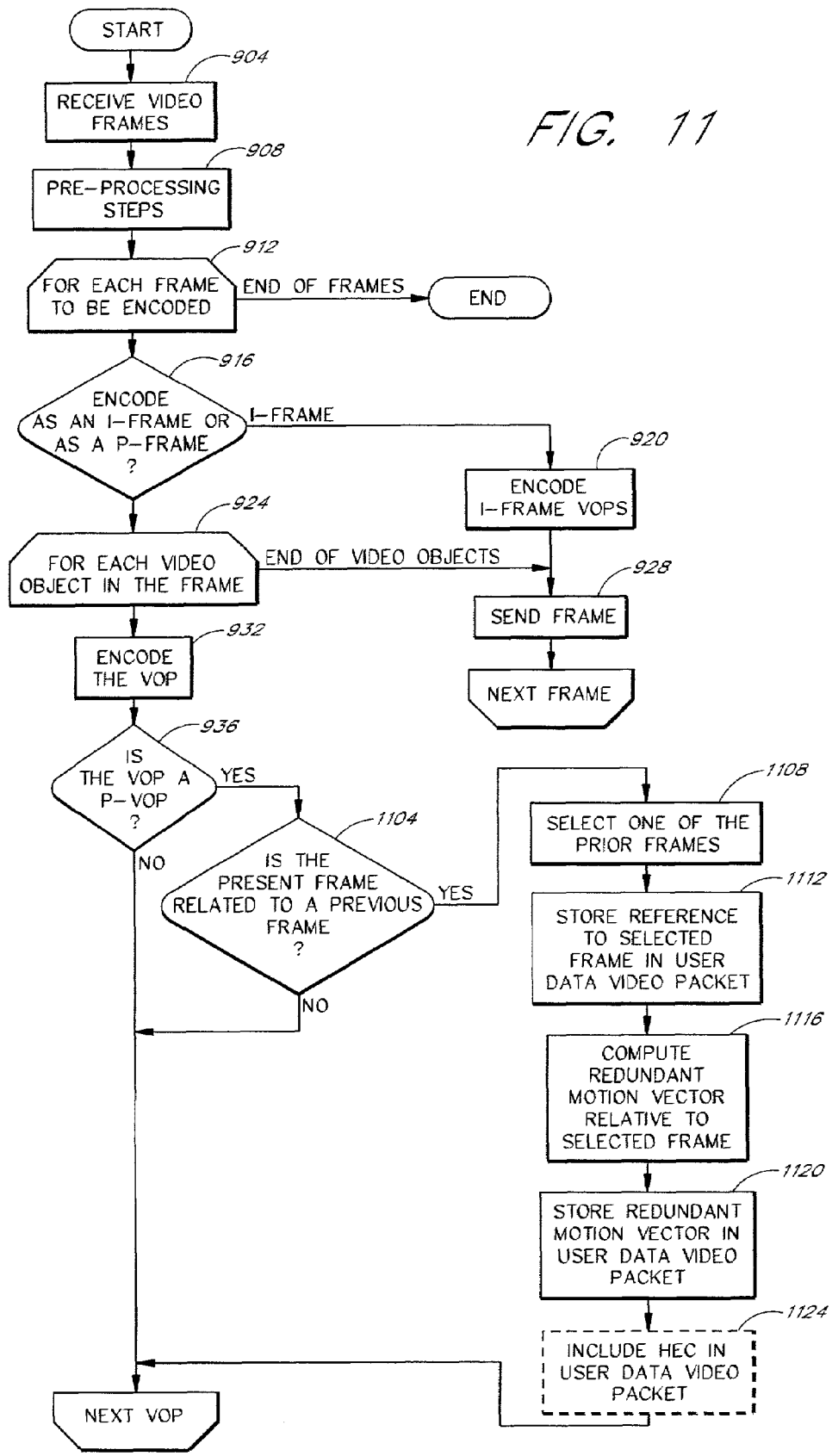
FIG. 11 is a flowchart that generally illustrates another process according to an embodiment of the invention of encoding a portion of a video bitstream to include a redundant motion vector, where the redundant motion vector can be referenced to a selected previous frame.

FIG. 11 is a flowchart 1100 that generally illustrates another process according to an embodiment of the invention of encoding a portion of a video bitstream to include a redundant motion vector, where the redundant motion vector can be referenced to a selected previous frame. The process described by the flowchart 1100 of FIG. 11 advantageously encodes a video bitstream with redundant motion vectors, as does the process described in connection with FIG. 9, but the process of FIG. 11 can selectively reference a motion vector from one of the frames that is prior to the immediately previous frame to the current frame.

In one embodiment, the first state 904, the second state 908, the start of the first FOR loop 912, the first decision block 916, the third state 920, the start of the second FOR loop 924, the fourth state 928, and the fifth state 932 of the flowchart 1100 are as described earlier in connection with FIG. 9.

In the second decision block 936, the process determines whether the VOP was encoded as an I-VOP or as a P-VOP. The process proceeds from the second decision block 936 to a third decision block 1104 when the VOP corresponds to a P-VOP. The process returns from the second decision block 936 to the start of the second FOR loop 924.

In the third decision block 1104, the process determines whether a frame that is prior to the previous frame is related to the present frame. The frame that is prior to the previous frame can include the previous-previous frame, but can also include other previous frames as well, i.e., whether a frame at time k−2, k−3, k−4 and the like, is related to the frame at time k. The process proceeds from the third decision block 1104 to a sixth state 1108 when a frame that is prior to the previous frame is related to the present frame.

The process returns from the third decision block 1104 to the start of the second FOR loop 924 when a frame that is prior to the previous frame is unrelated to the present frame. When a frame that is prior to the previous frame is unrelated to the present frame, a P-VOP in the present frame should not be referenced to any of the frames prior to the previous frame. An example of when a frame that is prior to the previous frame may be unrelated to the present frame occurs when there is an intervening scene change between the frames prior to the previous frame and the present frame. As described earlier in connection with FIG. 10, one embodiment of the process further encodes scene changes and/or rapidly changing scenes as consecutive I-VOPs, so that a redundant motion vector in a present frame can use a VOP in a frame prior to the previous frame as a reference VOP and provide robust encoding.

In the sixth state 1108, the process selects one of the frames that is prior to the previous frame. A VOP from the selected frame will be used as a reference for the redundant motion vector of the present frame. In one embodiment, the frame is selected by matching the VOP in the present frame to VOPs in the frames prior to the previous frame. A variety of techniques can be used to find a matching VOP. One example of a criterion includes a calculation and comparison of a sum of absolute differences (SAD) between the VOP in the present frame and the VOPs in the frames prior to the previous frame as displaced by appropriate motion vector estimates. It will be understood by one of ordinary skill in the art that multiple estimates for the motion vector may be computed in the sixth state 1108. The process advances from the sixth state 1108 to a seventh state 1112.

In the seventh state 1112, the process stores a reference to the selected frame in a user data video packet. The reference can correspond to a variety of values, such as a time lag value that indicates how far back the reference frame is in time, a number that corresponds to a count of frames back in the sequence, and the like. As described earlier in connection with FIG. 9, storage of data in the user data video packet allows the generated video bitstream to be downward compatible with standard MPEG-4 decoders. Although a reference MPEG-4 decoder is not capable of using data captured in a user data video packet, the presence of the redundant motion vector data advantageously does not disturb the MPEG-4 decoder from decoding the other portions of the video bitstream, which can comply with the MPEG-4 standard. The user data video packet is indicated by providing a user data start code, which is B2 (hex), as the start code of the data packet. The user data start code provides an indication to a reference MPEG-4 decoder that the reference MPEG-4 decoder should ignore data between the user data start code and the next start code received in the bitstream. Further details of the user data video packet are described later in connection with FIG. 12B. The process advances from the seventh state 1112 to an eighth state 1116.

In the eighth state 1116, the process stores a redundant motion vector for the present VOP based on a corresponding VOP in the selected frame. The redundant motion vector can be calculated or can be retrieved from an earlier calculation, such as from a calculation in the sixth state 1108. The process advances from the eighth state 1116 to a ninth state 1120.

In the ninth state 1120, the process stores the redundant motion vector in the user data video packet as described earlier in connection with the seventh state 1112. The process advances from the ninth state 1120 to an optional tenth state 1124.

In the optional tenth state 1124, the process includes a header extension code (HEC) to the user data video packet generated in the ninth state 1120. The presence of the HEC permits a decoder that is capable of utilizing the redundant motion vector to use the contents of the user data video packet, i.e., use the redundant motion vector, even if the other packets relating to the P-VOP are lost. The process returns from the optional tenth state 1124 to the start of the second FOR loop 924 to process the next VOP.

FIG. 12A illustrates a sample of a video bitstream 1200 according to the prior art. The video bitstream 1200 carries the contents of the video frames or VOPs. It will be understood that a VOP can be a video frame. For the purposes of illustration, the portion of the video bitstream 1200 shown in FIG. 12A corresponds to a first frame 1202, $F_k$, and to a second frame 1204, $F_{(k+1)}$ (or to VOPs). The frames or VOPs are divided into multiple video packets (VP), which are carried by the video bitstream 1200. A portion of the multiple VPs that correspond to the first frame or VOP 1202, $F_k$, is shown by a first VP 1206, which in one embodiment includes a VOP start code, a second VP 1208, a third VP 1210, and a fourth VP 1212. A portion of the multiple VPs that correspond to the second frame or VOP 1204, $F_{(k+1)}$, is shown in FIG. 12A by a fifth VP 1220, a sixth VP 1222, a seventh VP 1224, and an eighth VP 1226.

FIG. 12B illustrates a sample of a video bitstream 1250 according to an embodiment of the invention. The video bitstream 1250 includes redundant motion vectors for robust encoding of the encoded video. In addition, the video bitstream 1250 is advantageously backward compatible with a standard MPEG-4 decoder.

The illustrated portion of the video bitstream 1250 includes a first frame or VOP 1252, $F_k$, and a second frame or VOP 1254, $F_{(k+1)}$. The first frame 1252, $F_k$, includes multiple VPs. Where the first frame 1252, $F_k$, corresponds to a P-Frame, the VPs of the first frame 1252, $F_k$, can include VPs relating to both intra-codes and predictive-codes. P-Frames or P-VOPs are accompanied by user data video packets, which are used to carry data for the redundant motion vectors in a manner such that the video bitstream remains compliant with MPEG-4 syntax and is backward compatible with a standard MPEG-4 decoder.

A portion of the VOPs corresponding to the first frame 1252, $F_k$, is illustrated in FIG. 12B. The exemplary VPs shown in FIG. 12A for the first frame 1252, $F_k$, include a first VP 1256, $VP_{k,0}$, a second-to-last VP 1258, $VP_{k,m-2}$, a next-to-last VP 1262, $VP_{k,m-1}$, and a last VP 1266, $VP_{k,m}$.

A redundant motion vector corresponding can be carried by a first user data video packet 1260, $UDVP_{k,m-2}$. In another embodiment, the corresponding user data video packets follow the video packets (VPs) for the related P-VOP or P-Frame. The first user data video packet 1260, $UDVP_{k,m-2}$, includes a user data start code, which is B2 (hex) in MPEG-4, to indicate the start of a user data video packet.

Not every VOP or Frame in the video bitstream 1250 will necessarily have a corresponding redundant motion vector carried in a user data video packet. In one embodiment, the video bitstream 1250 includes a redundant motion vector in a user data video packet for each P-Frame or P-VOP for which a redundant motion vector can be computed. For example, a VP following the first frame or VOP 1252 in the bitstream can carry a user data video packet with the redundant motion vector.

In addition, by encoding two I-Frames sequentially where an I-Frame is used, one embodiment can computer a redundant motion vector for each P-Frame or P-VOP in the video sequence. However, in other embodiments, not all P-Frames or P-VOPs will include corresponding redundant motion vectors in user data video packets. For example, where a frame prior to the previous frame is unrelated to the present frame, a redundant motion vector should also not be provided with a P-Frame or P-VOP. In addition, in a system where bandwidth limitations are a constraint, user data video packets can also be selectively removed from the video bitstream so that less than all computable redundant motion vectors may be carried by the video bitstream 1250.

In one embodiment, the user data video packet corresponding to a P-Frame or P-VOP is positioned later in time in the video bitstream than the P-Frame or P-VOP. However, it will be understood by one of ordinary skill in the art that in other embodiments, the user data video packet can also be positioned ahead of the corresponding P-Frame or P-VOP in the video bitstream.

The second frame 1254, $F_{(k+1)}$, illustrates another example of the video bitstream 1250 with user data video packets. The illustrated portion of the video bitstream 1250 corresponding to the second frame 1254, $F_{(k+1)}$, includes multiple VPs 1270, 1272, 1274, 1278. A user data video packet 1276, $UDVP_{k+1,m-1}$, carries a redundant motion vector that corresponds to the VP 1274, $VP_{k+1,m-1}$.

It will be understood by one of ordinary skill in the art that a user data video packet can also be used to carry other data. In one embodiment, a user data header code is included by the encoder after the user data start code to indicate the type of data that follows. For example, the user data header code can be used to indicate that the following data is a redundant motion vector, a header extension code (HEC), a lag value or other value that indicates the reference frame for the redundant motion vector, and the like. For example, the user data header code can correspond to a 16-bit code. It will be understood by one of ordinary skill in the art that in other embodiments, the number of bits in the user data header code can vary in a wide range. For example, in another embodiment, the header code can correspond to an 8-bit code. In one embodiment, multiple amounts of supplemental data, such as a redundant motion vector and a lag value, is carried in a single user data video packet. In other embodiments, separate user data video packets carry the multiple amounts of supplemental data.

FIG. 13 is a high-level block diagram of a video decoder 1300 according to an embodiment of the invention. The video decoder 1300 can be implemented by dedicated hardware or by software executing in a general-purpose computer. An encoded bitstream 1302 is provided as an input to a demultiplexer 1304. The demultiplexer 1304 reads start code values in the video bitstream and allocates the visual data to the appropriate decoder. The visual data is distributed to a VOP decoder 1306, a face decoder 1308, a still texture decoder 1310, and a mesh decoder 1312.

The VOP decoder 1306 further includes a shape decoder, a motion compensation decoder, and a texture decoder. The VOP decoder 1306 combines the decoded shape information, motion information, and texture information to reconstruct a VOP. One embodiment of a VOP decoder is described in greater detail later in connection with FIG. 14.

The face decoder 1308 decodes face objects. The still texture decoder 1310 decodes still texture objects. The mesh decoder 1312 decodes mesh objects, which can include motion referenced components. Outputs of the VOP decoder 1306, the face decoder 1308, the still texture decoder 1310, and the mesh decoder 1312 are provided to a composition stage, which integrates the various visual objects together to form the visual picture.

Figure 14:
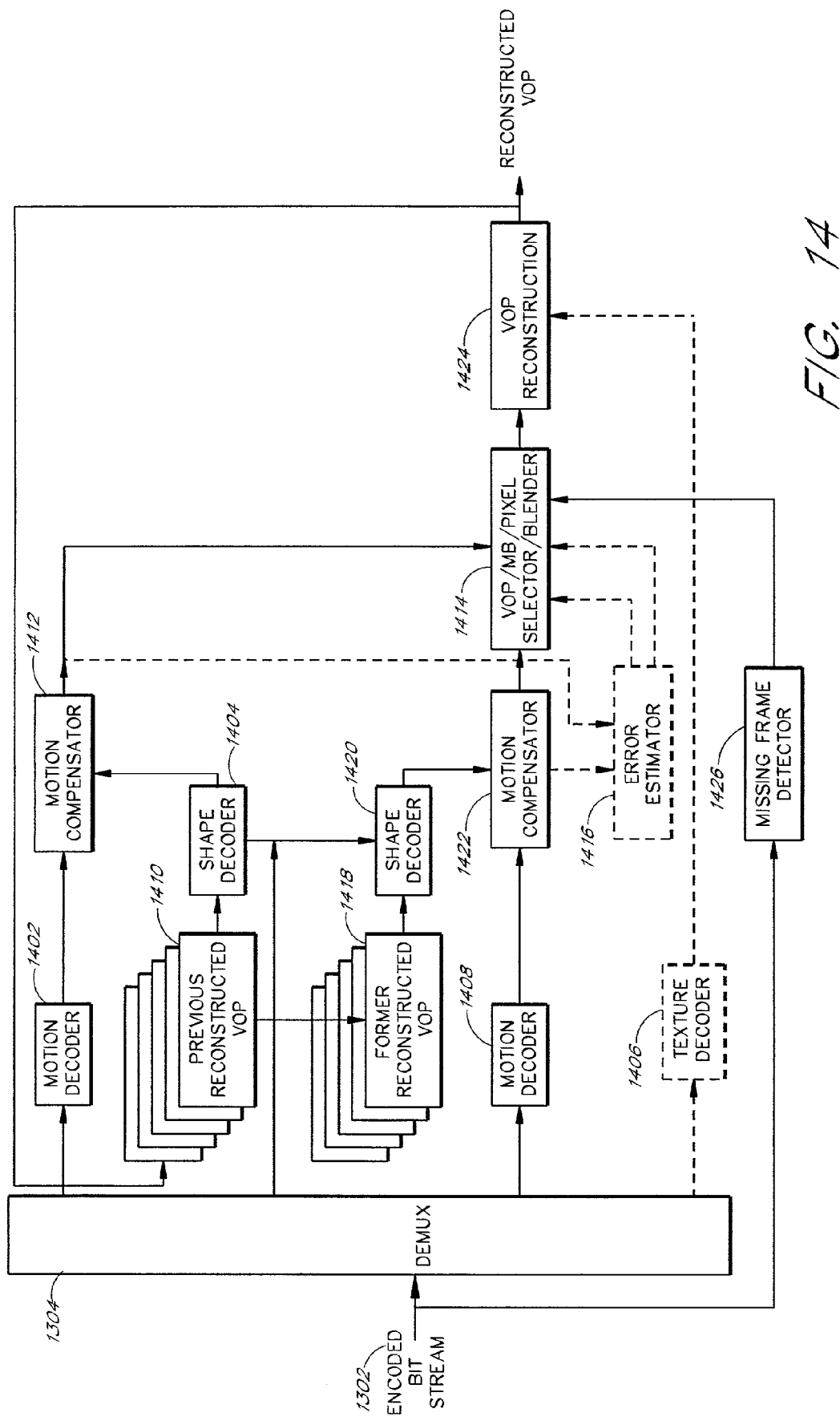
FIG. 14 is a block diagram of a video object plane (VOP) decoder according to an embodiment of the invention.

FIG. 14 is a block diagram of a video object plane (VOP) decoder 1400 according to an embodiment of the invention. The VOP decoder 1400 can be implemented by dedicated hardware or by software executing in a general-purpose computer. The encoded bitstream 1302 is provided as an input to the demultiplexer 1304, which distributes the data in the bitstream according to corresponding start code values associated with the data. For the decoding of a VOP according to the MPEG-4 standard, the demultiplexer 1304 provides data corresponding to a start code value of B6 (hex), i.e., a bit string of 000001B6 for the VOP start code. A variety of other data identifiers instructs the VOP decoder 1400 how to interpret the encoded data. For example, a video encoding type identifier instructs the VOP decoder 1400 whether the encoded data corresponds to an I-VOP, a P-VOP, a B-VOP, or an S-VOP.

Data following a VOP start code is directed to one of a first motion decoder 1402, a first shape decoder 1404, or an optional texture decoder 1406. In one embodiment, the video bitstream carries the redundant motion vector data in a user data video packet, which is ignored by the first motion decoder 1402. Data following a user data start code is directed by the demultiplexer 1304 to a second motion decoder 1408.

The first shape decoder 1404 decodes the shape of the video object. For example, the shape of the video object can correspond to a rectangular shape. A first memory 1410 stores the reconstructed VOPs of the previous frame, which is the reference frame for a standard MPEG-4 decoder. The first motion decoder 1402 decodes a motion vector and a first motion compensator 1412 relates shifts of a reconstructed VOP in the prior reference frame with the motion vector to generate a VOP for the present frame. The VOP calculated by the first motion compensator 1412 is provided as an input to a VOP/MB/Pixel Selector/Blender 1414 and optionally to an optional error estimator 1416.

A second memory 1418 stores reference VOPs for the redundant motion vector. The term "former reconstructed VOP" will be used herein to denote the reference VOP for the redundant motion vector. For example, the second memory 1418 can store the reconstructed VOPs of the previous-previous frame as a reference frame for the redundant motion vector. It will be understood by one of ordinary skill in the art that the second memory 1418 can include VOPs of other frames, where frames other than the previous-previous frame can also be used as a reference frame for the redundant motion vectors. An output of the first memory 1410 is provided as an input to the second memory 1418 as new VOPs are reconstructed. It will be understood by one of ordinary skill in the art that the first memory 1410 and the second memory 1418 can be formed from separate address spaces within the same memory device, and that a transfer of data between the first memory 1410 and the second memory 1418 can effectively be implemented by shifting addresses.

A second shape decoder 1420 decodes the shape of the video object. The second shape decoder 1420 can receive the same encoded shape information as the first shape decoder 1404. In one embodiment, the second shape decoder 1420 is the same as the first shape decoder 1404. An output of the second shape decoder 1420 is provided as inputs to a second motion compensator 1422.

The second motion decoder 1408 decodes the redundant motion vector and provides the decoded redundant motion vector as an input to the second motion compensator 1422. In one embodiment, the redundant motion vector is carried by the encoded bitstream 1302 in a user data video packet, and the redundant motion vector is stripped from the encoded bitstream 1302 by the demultiplexer 1304 by detection of the user data start code and the like. However, the skilled practitioner will appreciate that in another standard, whether existing or yet to be developed, a redundant motion vector can be designated with its own start code or equivalent, and the demultiplexer 1304 can strip the redundant motion vector from the encoded bitstream 1302 accordingly. The second motion compensator 1422 generates a redundant VOP by combining the reconstructed former VOP from the second memory 1418 with the motion vector from the motion decoder 1408. An output of the second motion compensator 1422 is provided as an input to the VOP/MB/Pixel Selector/Blender 1414 and optionally to the optional error estimator 1416.

The VOP/MB/Pixel Selector/Blender 1414 can select between the VOP, macroblock, or pixel provided by the first motion compensator 1412 and the VOP provided by the second motion compensator 1422. These can be provided individually for Y, U, and V values. The VOP/MB/Pixel Selector/Blender 1414 can also weigh contributions from a previous frame and previous-previous frame in accordance with an inverse of a relative expected error between the reconstruction with the previous frame and reconstruction with the previous-previous frame. The VOP/MB/Pixel Selector/Blender 1414 provides the selected or blended VOP, macroblock, or pixel as an input to a VOP reconstruction stage 1424.

If only one of the VOPs generated by the first motion compensator 1412 and the second motion compensator 1422 is available, the VOP/MB/Pixel Selector/Blender 1414 selects the available VOP. In one embodiment, when the previous frame is available and a VOP can be reconstructed from the previous frame, the VOP/MB/Pixel Selector/Blender 1414 selects the output of the first motion compensator 1412. The VOP/MB/Pixel Selector/Blender 1414 selects the output of the second motion compensator 1422 when the previous frame is not available and a VOP cannot be reconstructed from the previous frame. A missing frame detector 1426 can detect missing or dropped frames by monitoring the encoded bitstream 1302 and providing an indication to the VOP/MB/Pixel Selector/Blender 1414. The missing frame detector 1426 can detect a missing frame by observing time stamps, observing gaps, and the like.

In another embodiment, when both VOPs from the first motion compensator 1412 and the second motion compensator 1422 are available, the optional error estimator 1416 selects between the VOP from the first motion compensator 1412 and the second motion compensator 1422 such that the VOP from the first motion compensator 1412 is not necessarily the selected VOP. For example, a criterion such as sum of absolute differences (SAD) may indicate that a VOP generated from the former reconstructed VOP and provided by the second motion compensator 1422 may result in a better picture. In another embodiment, the outputs of the first motion compensator 1412 and the second motion compensator 1422 are blended or combined to provide minimal mean squared error (MMSE) decoding.

The optional texture decoder 1406 decodes the texture by applying a variety of decoding techniques, such as inverse discrete cosine transform techniques. An output of the optional texture decoder 1406 may be optionally provided as an input to the VOP reconstruction stage 1424, which combines the texture information with the shape decoded and motion compensated VOP to generated a reconstructed VOP 1428. The reconstructed VOP 1428 is provided as an input to the first memory 1410 for possible future use as a reference VOP.

Figure 15:
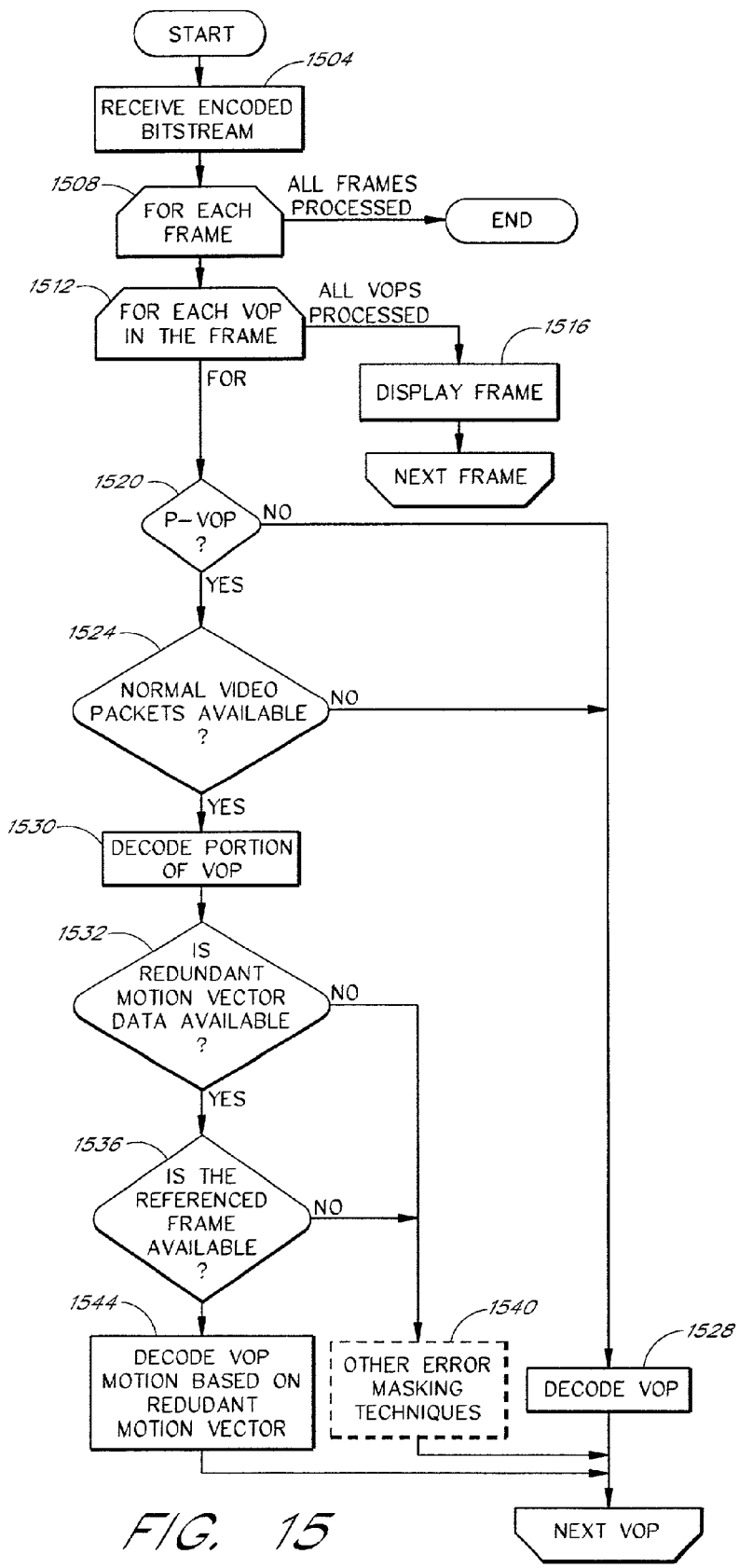
FIG. 15 is a flowchart that generally illustrates a process according to an embodiment of the invention of decoding a video bitstream encoded with redundant motion vectors, where the process uses a redundant motion vector as a backup to a standard motion vector.

FIG. 15 is a flowchart 1500 that generally illustrates a process according to an embodiment of the invention of decoding a video bitstream encoded with redundant motion vectors, where the process uses a redundant motion vector as a backup to a standard motion vector. One embodiment of the process is implemented as a plug-in to a Web browser, such as Microsoft® Internet Explorer developed by Microsoft Corporation. The process can be performed either in real time or asynchronously in a batch process. Where a user is viewing the decoded video bitstream, the process should be performed in real time. Another process, which will be described later in connection with FIG. 16, uses the redundant motion not only as a backup, but also as an alternative to the standard motion vector.

The process starts at a first state 1504, where the process receives an encoded video bitstream. The process can receive the encoded video bitstream from a computer network, through wireless communication, and the like. The process advances from the first state 1504 to a start of a first FOR loop 1508.

In the start of the first FOR loop 1508, the process evaluates whether the frames in the video bitstream have been processed, i.e., whether there is more data to decode from the video bitstream or whether processing is complete. For example, a video clip, such as an advertisement or a movie may come to an end. In other examples, a video teleconferencing session may come to an end, or a connection to the video bitstream may be lost. When the frames in the video bitstream have been processed, the process ends. When there are more frames to be processed, the process proceeds from the start of the first FOR loop 1508 to a start of a second FOR loop 1512. It will be understood by one of ordinary skill in the art that the first FOR loop 1508 and the second FOR loop 1512 can be implemented by a variety of types of loops, and the FOR loops shown in FIG. 15 are presented only to illustrate one embodiment of the process.

In the start of the second FOR loop 1512, the process evaluates whether there are more VOPs to be processed in the present frame. When the VOPs of the present frame have been processed, the process proceeds from the second FOR loop 1512 to a second state 1516, where the process reconstructs the frame from the decoded VOPs. The process returns from the second state 1516 to the start of the first FOR loop 1508 to process the next frame. When there are more VOPs to be processed for the present frame, the process proceeds from the start of the second FOR loop 1512 to a first decision block 1520.

In the first decision block 1520, the process evaluates whether the encoded VOP that is to be decoded corresponds to a P-VOP or not. In one embodiment, the process reads the 2-bit vop_coding_type header to determine the type of VOP. A vop_coding_type value of 01 binary indicates that the data corresponds to a P-VOP. When the encoded VOP is a P-VOP, the process proceeds from the first decision block 1520 to a second decision block 1524. When the encoded VOP is not a P-VOP, e.g., is an I-VOP, the process proceeds from the first decision block 1520 to a third state 1528, where the VOP is decoded.

In the second decision block 1524, the process determines whether normal video packets are available. In one embodiment, the second decision block 1524 determines whether any normal video packet is available. When normal video packets are available, the process proceeds from the second decision block 1524 to decode state 1530.

In the decode state 1530, the process decodes the normal video packets that are available and advances to a third decision block 1532 to decode with a redundant motion vector, if available. When the previous frame is available as a reference frame, the process proceeds from the second decision block 1524 to the third state 1528.

In the third state 1528, the process decodes the VOP. For example, where the VOP corresponds to an I-VOP, the I-VOP can be decoded without reference to the contents of another frame. In another example, where the VOP corresponds to a P-VOP and the previous frame is available as a reference, the process decodes the VOP by techniques such as motion compensating the reference VOP in the reference frame by the motion vector indicated in the P-VOP. The process returns from the third state 1528 to the start of the second FOR loop 1512.

In the third decision block 1532, the process determines whether a redundant motion vector is available. In one embodiment, the process retrieves the redundant motion vector from a user data video packet that follows the VOP in the video bitstream. In one embodiment, the redundant motion vector is identified within the user data video packet by monitoring a user data header code, such as a 16-bit code, that designates that the data in the user data video packet following the user data header code corresponds to a redundant motion vector. The skilled practitioner will appreciate that a redundant motion vector may not always be encoded in the video bitstream. For example, where bandwidth were limited, or where there was a scene change between the previous frame and the present frame, the encoding system may selectively include a redundant motion vector for each P-VOP. In addition, a redundant motion vector that is encoded in the video bitstream may not always be available. For example, data for a redundant motion vector may become corrupted or get lost during transmission.

The process proceeds from the third decision block 1532 to a fourth decision block 1536 when the applicable redundant motion vector is available. When the redundant motion vector is not available, the process optionally proceeds from the third decision block 1532 to an optional fourth state 1540, where the process applies error masking techniques.

In the fourth decision block 1536, the process determines whether the reference frame for the redundant motion vector is available. In one embodiment, the reference frame for the redundant motion vector is the previous-previous frame. In another embodiment, the reference frame for the redundant motion vector is selected from multiple frames that are prior to the previous frame. A lag value can be retrieved from the user data video packet to determine which frame is to be used as the reference frame. If the frame that is referenced by the redundant motion vector is available, the process proceeds from the fourth decision block 1536 to a fifth state 1544. Otherwise, the process optionally proceeds from the fourth decision block 1536 to the optional fourth state 1540.

In the optional fourth state 1540, the process applies error masking techniques to mask the error from a lack of data. For example, the process can copy surrounding visual data, can interpolate surrounding data, and the like. The process returns from the optional fourth state 1540 to the start of the second FOR loop 1512 to process the next VOP.

In the fifth state 1544, the process decodes or reconstructs the VOP by combining the redundant motion vector with the appropriate VOP from the reference frame. Advantageously, the process reconstructs a VOP in the fifth state 1544 that is not available to be decoded by a standard MPEG-4 decoding process. The VOP reconstructed from the redundant motion vector allows a picture to be displayed with a relatively low error, and further advantageously can decrease the error propagation of a missing or dropped frame in subsequent frames.

Figure 16:
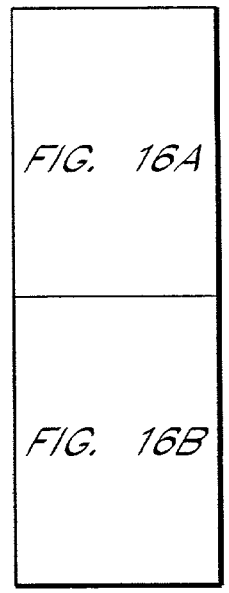
FIG. 16 consists of FIGS. 16A and 16B and is a flowchart that generally illustrates another process according to an embodiment of the invention of decoding a video bitstream encoded with redundant motion vectors, where the process uses a redundant motion vectors as a backup to a standard motion vector or in response to a high error estimate.
Figure 16A:
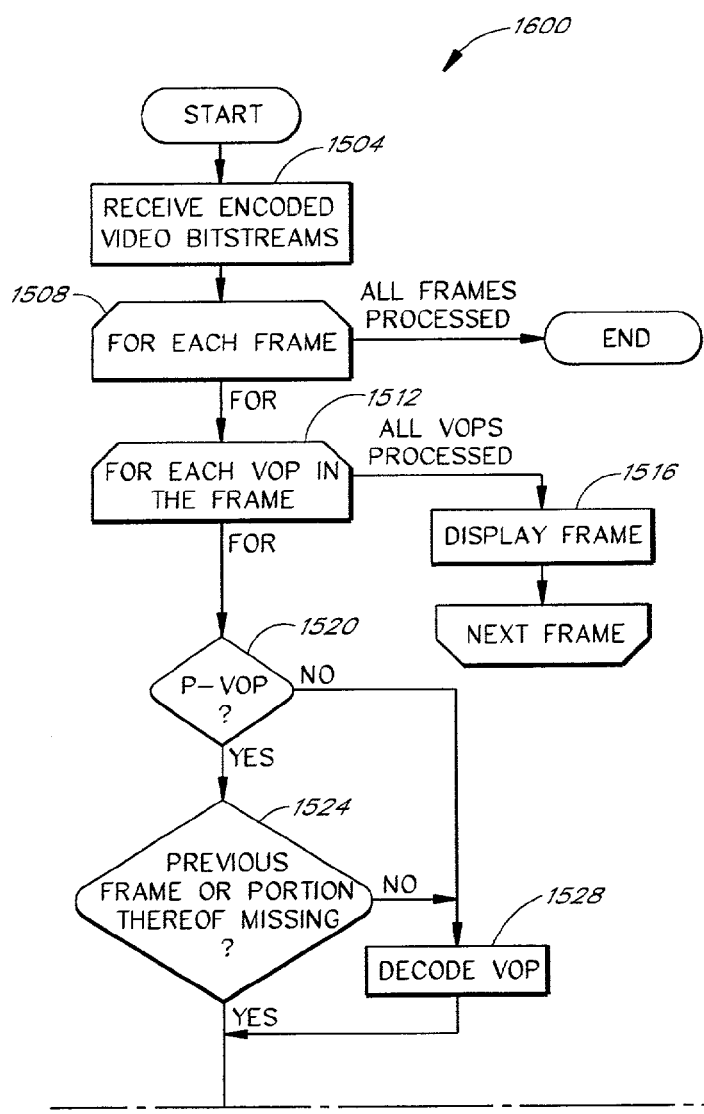
Figure 16B:
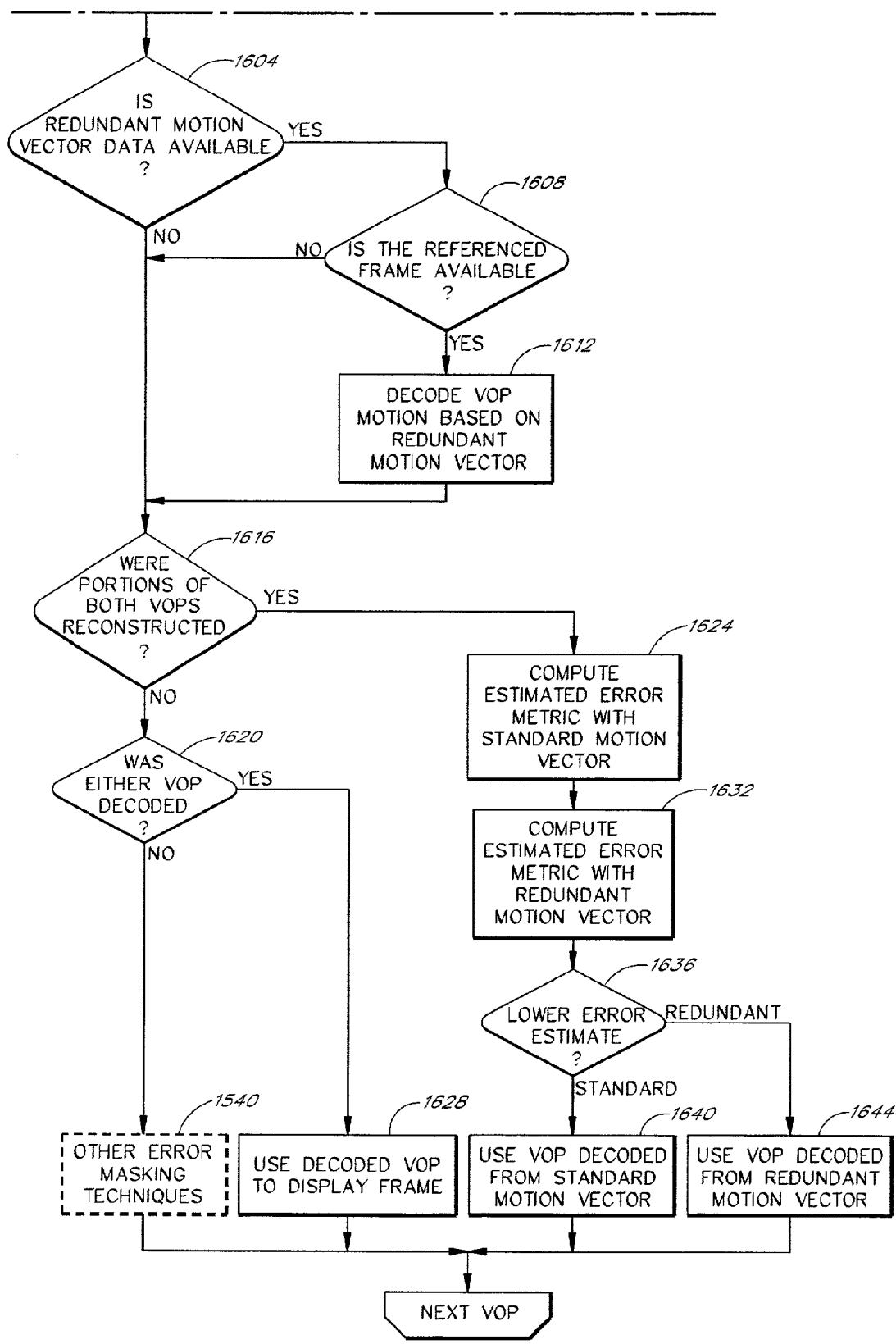

FIG. 16 is a flowchart 1600 that generally illustrates another process according to an embodiment of the invention of decoding a video bitstream encoded with redundant motion vectors, where the process uses a redundant motion vector as a backup to a standard motion vector or in response to a high error estimate. The process can be performed either in real time or asynchronously in a batch process. Where a user is viewing the decoded video bitstream, the process should be performed in real time. In common with the process described earlier in connection with FIG. 15, the process of FIG. 16 can use a redundant motion vector to generate a VOP when a reference frame for a standard motion vector is not available. In contrast to the process of FIG. 15, the process of FIG. 16 can also advantageously replace the VOP generated by the standard motion vector when the process determines that a likelihood of corruption in the VOP generated by the standard motion vector is relatively high.

In one embodiment, the first state 1504, the start of the first FOR loop 1508, the start of the second FOR loop 1512, the first decision block 1520, the second decision block 1524, the third state 1528, and the optional fourth state 1540 are as described earlier in connection with FIG. 15.

In the second decision block 1524, the process of FIG. 16 determines whether the previous frame or portion thereof is missing or has been dropped. When the previous frame or portion is missing, the process proceeds from the second decision block 1524 to a third decision block 1604 to determine whether decoding with a redundant motion vector is available. In one embodiment, when any normal data is available, the normal data is decoded and used. When the previous frame is available as a reference frame, the process proceeds from the second decision block 1524 to the third state 1528.

In the third state 1528, the process decodes the VOP. The decoded VOP can correspond to, for example, an I-VOP or to a P-VOP. The process advances from the third state 1528 to the third decision block 1604.

In the third decision block 1604, the process determines whether a redundant motion vector is available. As described earlier in connection with the third decision block 1532 of FIG. 15, a redundant motion vector may not always be available in the video bitstream. When a redundant motion vector is available, the process proceeds from the third decision block 1604 to a fourth decision block 1608. Otherwise, the process proceeds from the third decision block to a fifth decision block 1616.

In the fourth decision block 1608, the process determines whether the reference frame corresponding to the redundant motion vector is available. For example, the reference frame can correspond to the previous-previous frame. In other embodiments, the reference frame can be selected from frames that were received prior to the previous frame. The appropriate frame can be selected by, for example, relating the appropriate frame to a lag value corresponding to the redundant motion vector. The process proceeds from the fourth decision block 1608 to the fifth state 1612 when the reference frame is available. Otherwise, the process proceeds from the fourth decision block 1608 to the fifth decision block 1616.

In the fifth state 1612, the process decodes or reconstructs the VOP, the macroblock, or the pixel, by combining the redundant motion vector and the reference VOP from the reference frame. Y, U, and V values can be treated independently. For purposes of illustration, the process is described in the context of a VOP, but the skilled practitioner will appreciate that it can also apply to macroblocks and to pixels. The VOP reconstructed from the redundant motion vector advantageously provides a VOP, and potentially, an entire frame, to be generated even when the reference frame for the standard motion vector is not available. In addition, a VOP reconstructed from the redundant motion vector also provides an alternative VOP to the VOP reconstructed from the standard motion vector, thereby allowing the process to advantageously select between the VOPs to reduce error in the displayed picture as will be described in further detail later. The process advances from the fifth state 1612 to the fifth decision block 1616.

In the fifth decision block 1616, the process determines whether portions of both VOPs (or macroblocks or pixels) were reconstructed, i.e., whether portions from both the VOP from the standard motion vector and the VOP from the redundant motion vector were reconstructed. The Y, U, and V components can be treated independently. The process proceeds from the fifth decision block 1616 to a sixth state 1624 when portions of both VOPs were reconstructed. Otherwise, the process proceeds from the fifth decision block 1616 to a sixth decision block 1620.

In the sixth decision block 1620, the process determines whether either VOP was decoded or reconstructed. If no VOP was reconstructed, the process proceeds from the sixth decision block 1620 to the optional fourth state 1540, where the process may apply an error masking technique to substitute for the missing VOP, and the process returns to the start of the second FOR loop 1512 to process the next VOP. When one of the VOPs was decoded, the process proceeds from the sixth decision block 1620 to the seventh state 1628, where the process uses the decoded VOP in the present frame. The process returns from the seventh state 1628 to the start of the second FOR loop 1512 to process the next VOP.

In the sixth state 1624, the process computes a statistical measure of error relating to the VOP reconstructed from the standard motion vector. For example, the process can compute a minimal mean square error (MMSE) of the VOP. The process advances from the sixth state 1624, to an eighth state 1632, where the process computes a comparable statistical measure of error relating to the VOP reconstructed from the redundant motion vector. The process advances from the eighth state 1632 to a seventh decision block 1636.

In the seventh decision block 1636, the process determines which VOP reconstructed a result with a smaller error estimate. When the VOP generated from the standard motion vector produces a lower error estimate, the process proceeds from the seventh decision block 1636 to a ninth state 1640, and the process uses the VOP decoded from the standard motion vector in the present frame. When the VOP reconstructed from the redundant motion vector produces a lower error estimate, the process proceeds from the seventh decision block 1636 to a tenth state 1644, where the process uses the VOP decoded from the redundant motion vector in the present frame. The process advances from either the ninth state 1640 or from the tenth state 1644 to the start of the second FOR loop 1512 to continue to process the next VOP.

Various embodiments of the invention have been described above. Although this invention has been described with reference to these specific embodiments, the descriptions are intended to be illustrative of the invention and are not intended to be limiting. Various modifications and applications may occur to those skilled in the art without departing from the true spirit and scope of the invention as defined in the appended claims.

Appendix A

Incorporation by Reference of Commonly Owned Applications

The following patent applications, commonly owned and filed on the same day as the present application, are hereby incorporated herein in their entirety by reference thereto:

| Title | Application No. | Attorney Docket No. |
|---|---|---|
| SYSTEMS AND METHODS FOR ENHANCED ERROR CONCEALMENT IN A VIDEO DECODER | 10/092,366 | INTV.005A |
| SYSTEMS AND METHODS FOR DECODING OF PARTIALLY CORRUPTED REVERSIBLE VARIABLE LENGTH CODE (RVLC) INTRA-CODED MACROBLOCKS AND PARTIAL BLOCK DECODING OF CORRUPTED MACROBLOCKS IN A VIDEO DECODER | 10/092,376 | INTV.006A |
| SYSTEMS AND METHODS FOR DECODING OF SYSTEMATIC FORWARD ERROR CORRECTION (FEC) CODES OF SELECTED DATA IN A VIDEO BITSTREAM | 10/092,353 | INTV.007A |
| SYSTEMS AND METHODS FOR MANAGEMENT OF DATA IN A RING BUFFER FOR ERROR RESILIENT DECODING OF A VIDEO BITSTREAM | 10/092,384 | INTV.008A |
| SYSTEMS AND METHODS FOR REDUCING ERROR PROPAGATION IN A VIDEO DATA STREAM | 10/092,340 | INTV.009A |
| SYSTEMS AND METHODS FOR REFRESHING MACROBLOCKS | 10/092,375 | INTV.010A |
| SYSTEMS AND METHODS FOR REDUCING FRAME RATES IN A VIDEO DATA STREAM | 10/092,345 | INTV.011A |
| SYSTEMS AND METHODS FOR GENERATING ERROR CORRECTION INFORMATION FOR A MEDIA STREAM | 10/092,392 | INTV.012A |
| SYSTEMS AND METHODS FOR PERFORMING BIT RATE ALLOCATION FOR A VIDEO DATA STREAM | 10/092,383 | INTV.013A |
| SYSTEMS AND METHODS FOR ENCODING REDUNDANT MOTION VECTORS IN COMPRESSED VIDEO BITSTREAMS | 10/092,373 | INTV.014A |
| SYSTEMS AND METHODS FOR DETECTING SCENE CHANGES IN A VIDEO DATA STREAM | 10/092,394 | INTV.016A |

What is claimed is:

1. A video decoder adapted to decode robustly encoded video information comprising: a demultiplexer adapted to parse data from the video bitstream; motion decoder configured to receive motion information from the demultiplexer, where the motion decoder is configured to be able to decode motion information for a standard motion vector, which is referenced to a previous frame, where the motion decoder is further configured to be able to decode motion information from a redundant motion vector, which is referenced to a frame prior to the previous frame; a texture decoder configured to receive texture information from the demultiplexer and decode a texture of the VOP; and a composition circuit adapted to combine multiple VOPs to generate a video frame.

2. The video decoder as defined in claim 1, further comprising a shape decoder configured to receive shape information from the demultiplexer and decodes a shape of a video object plane (VOP) from the received data.

3. The video decoder as defined in claim 1, wherein the motion decoder is configured to decode motion from the standard motion vector when the previous frame is available.

4. The video decoder as defined in claim 1, wherein the motion decoder is configured to decode motion from the redundant motion vector when the previous frame is not available.

5. The video decoder as defined in claim 1, wherein the motion decoder is configured to decode motion from both the standard motion vector and the redundant motion vector and is further configured to select between a VOP reconstructed from the standard motion vector and a VOP reconstructed from the redundant motion vector.

6. The video decoder as defined in claim 1, wherein the motion decoder is configured to decode video bitstreams that are compliant with MPEG-4 syntax.

7. A video object plane (VOP) decoder in a video decoder that is adapted to decode a VOP in a first frame, comprising: a first memory configured to store a reconstructed VOP from a second frame, where the second frame is a frame immediately prior to the first frame; a second memory configured to store a reconstructed VOP from a third frame, where the third frame is a frame that is prior to the second frame; a first motion decoder configured to decode a standard motion vector from an encoded bitstream that is related to motion of the first reconstructed VOP in the first memory; a second motion decoder configured to decode a redundant motion vector from the encoded bitstream that is related to motion of the second reconstructed VOP in the second memory; and a motion compensator that is configured to reconstruct a VOP at least in part from information provided by at least one of the first motion decoder and the second motion decoder.

8. The VOP decoder as defined in claim 7, wherein the third frame stored by the second memory is a frame that is immediately prior to the second frame.

9. The VOP decoder as defined in claim 7, further comprising a selector module adapted to select between a VOP reconstructed at least in part from the standard motion vector and a VOP reconstructed at least in part from the redundant motion vector.

10. A video decoder configured to decode a video bitstream that includes redundant motion vectors for at least some predictive-coded video object planes (P-VOPs), the video decoder comprising: means for receiving the video bitstream; means for decoding video object planes (VOPS) of a first frame from the video bitstream; means for detecting that a first reference VOP from a second frame is not available, where the second frame is a reference frame for a standard motion vector for a P-VOP of the first frame; means for retrieving a redundant motion vector from the video bitstream, where the redundant motion vector uses a second reference VOP from a third frame earlier in time than the second frame as a reference; and means for reconstructing the P-VOP from the redundant motion vector and the second reference VOP.

* * * * *